(12) United States Patent
Abe et al.

(10) Patent No.: US 9,704,570 B2
(45) Date of Patent: Jul. 11, 2017

(54) SEMICONDUCTOR MEMORY DEVICE AND MEMORY SYSTEM

(71) Applicant: KABUSHIKI KAISHA TOSHIBA, Minato-ku (JP)

(72) Inventors: Kenichi Abe, Kawasaki (JP); Masanobu Shirakawa, Chigasaki (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/063,886

(22) Filed: Mar. 8, 2016

(65) Prior Publication Data

US 2016/0189770 A1   Jun. 30, 2016

Related U.S. Application Data

(63) Continuation of application No. PCT/JP2013/074952, filed on Sep. 13, 2013.

(51) Int. Cl.
| | |
|---|---|
| G11C 16/26 | (2006.01) |
| G11C 16/08 | (2006.01) |
| G11C 5/06 | (2006.01) |
| G11C 16/24 | (2006.01) |
| G11C 11/56 | (2006.01) |
| G11C 16/04 | (2006.01) |
| G11C 16/34 | (2006.01) |
| G11C 5/02 | (2006.01) |

(52) U.S. Cl.
CPC ...... *G11C 11/5642* (2013.01); *G11C 16/0483* (2013.01); *G11C 16/26* (2013.01); *G11C 16/3418* (2013.01); *G11C 5/02* (2013.01); *G11C 5/06* (2013.01); *G11C 16/08* (2013.01); *G11C 16/24* (2013.01)

(58) Field of Classification Search
CPC .......... G11C 16/26; G11C 16/24; G11C 5/02; G11C 16/0483; G11C 16/08; G11C 5/06
USPC ................. 365/185.17, 185.18, 63
See application file for complete search history.

(56) References Cited

U.S. PATENT DOCUMENTS

| | | |
|---|---|---|
| 5,559,956 A | 9/1996 | Sukegawa |
| 6,026,024 A | 2/2000 | Odani et al. |
| 7,080,192 B1 | 7/2006 | Wong |
| 7,333,364 B2 | 2/2008 | Yu et al. |

(Continued)

FOREIGN PATENT DOCUMENTS

| | | |
|---|---|---|
| CN | 101388248 A | 3/2009 |
| JP | 5-282880 A | 10/1993 |

(Continued)

OTHER PUBLICATIONS

Combined Taiwanese Office Action and Search Report issued on Mar. 21, 2016 in Patent Application No. 104126593.

(Continued)

*Primary Examiner* — Ly D Pham
(74) *Attorney, Agent, or Firm* — Oblon, McClelland, Maier & Neustadt, L.L.P.

(57) ABSTRACT

According to one embodiment, a semiconductor memory device includes first and second memory cells, a word line, and first and second bit lines. The first and second bit lines are electrically connected to one ends of the first and second memory cells, respectively. In retry reading, a voltage applied to the first bit line is different from a voltage applied to the second bit line.

22 Claims, 35 Drawing Sheets

(56) References Cited

U.S. PATENT DOCUMENTS

| | | |
|---|---|---|
| 2004/0213031 A1 | 10/2004 | Hosono et al. |
| 2004/0257888 A1 | 12/2004 | Noguchi et al. |
| 2005/0013171 A1 | 1/2005 | Ban et al. |
| 2005/0073884 A1 | 4/2005 | Gonzalez et al. |
| 2005/0162913 A1 | 7/2005 | Chen |
| 2007/0253256 A1 | 11/2007 | Aritome |
| 2007/0258306 A1 | 11/2007 | Riekels et al. |
| 2008/0106946 A1 | 5/2008 | Inoue et al. |
| 2008/0123420 A1 | 5/2008 | Brandman et al. |
| 2008/0270072 A1 | 10/2008 | Sukegawa |
| 2008/0285351 A1 | 11/2008 | Shlick et al. |
| 2009/0016103 A1 | 1/2009 | Kang et al. |
| 2009/0049364 A1 | 2/2009 | Jo et al. |
| 2009/0052257 A1 | 2/2009 | Park et al. |
| 2009/0067257 A1 | 3/2009 | Lee et al. |
| 2009/0073763 A1 | 3/2009 | Hosono |
| 2009/0164871 A1 | 6/2009 | Jo |
| 2009/0228640 A1 | 9/2009 | Kurashige |
| 2010/0157673 A1 | 6/2010 | Ota |
| 2010/0246257 A1 | 9/2010 | Ito et al. |
| 2011/0103149 A1 | 5/2011 | Katsumata et al. |
| 2012/0139030 A1 | 6/2012 | Sakuma et al. |
| 2012/0155168 A1* | 6/2012 | Kim .................. G11C 5/14 365/185.03 |
| 2013/0080858 A1 | 3/2013 | Lee et al. |
| 2013/0194867 A1* | 8/2013 | Fukuda .............. G11C 14/0018 365/185.08 |
| 2013/0205075 A1* | 8/2013 | Twitto .................. G11C 16/26 711/103 |
| 2013/0301353 A1* | 11/2013 | Twitto .................. G11C 16/16 365/185.09 |
| 2013/0322175 A1* | 12/2013 | Kong .................. G11C 16/10 365/185.11 |
| 2014/0304567 A1 | 10/2014 | Hida et al. |
| 2015/0221379 A1* | 8/2015 | Aritome .................. G11C 16/14 365/185.11 |

FOREIGN PATENT DOCUMENTS

| | | |
|---|---|---|
| JP | 8-77785 A | 3/1996 |
| JP | 10-255487 A | 9/1998 |
| JP | 2000-149580 A | 5/2000 |
| JP | 2004-326866 A | 11/2004 |
| JP | 2004-326867 A | 11/2004 |
| JP | 2007-507804 A | 3/2007 |
| JP | 2007-519162 | 7/2007 |
| JP | 2008-117471 A | 5/2008 |
| JP | 2008-269473 A | 11/2008 |
| JP | 2009-21000 | 1/2009 |
| JP | 2009-26436 A | 2/2009 |
| JP | 2009-48758 A | 3/2009 |
| JP | 2009-70501 A | 4/2009 |
| JP | 2009-70542 A | 4/2009 |
| JP | 2009-151919 A | 7/2009 |
| JP | 2009-205578 A | 9/2009 |
| JP | 2009-536423 A | 10/2009 |
| JP | 2010-140521 | 6/2010 |
| JP | 2010-287283 | 12/2010 |
| JP | 2011-96341 | 5/2011 |
| JP | 2013-73669 | 4/2013 |
| KR | 2008-0100791 A | 11/2008 |
| WO | WO 2009/110142 A1 | 9/2009 |
| WO | WO 2010/143306 A1 | 12/2010 |

OTHER PUBLICATIONS

International Search Report issued Dec. 17, 2013 in PCT/JP2013/074952 filed Sep. 13, 2013 (with English translation).
Written Opinion issued Dec. 17, 2013 in PCT/JP2013/074952 filed Sep. 13, 2013.
International Search Report issued on Feb. 8, 2011 in PCT/JP2010/069608 (with English translation).
Written Opinion issued Feb. 8, 2011 in PCT/JP2010/069608 (with English translation).
International Preliminary Report on Patentability issued on Jun. 21, 2012 in PCT/JP2010/069608.
Office Action issued on Mar. 19, 2013 in Japanese Patent Application No. 2009-255314 (with English translation).
Office Action issued on Oct. 22, 2013 in Korean Patent Application No. 10-2012-7006488 (with English translation).
Combined Taiwanese Office Action and Search Report issued Apr. 18, 2014 in Patent Application No. 099138212 (with English translation).
Combined Chinese Office Action and Search Report issued on Feb. 7, 2014 in Patent Application No. 201080040585.X (with English translation and English translation of categories of cited documents).

* cited by examiner

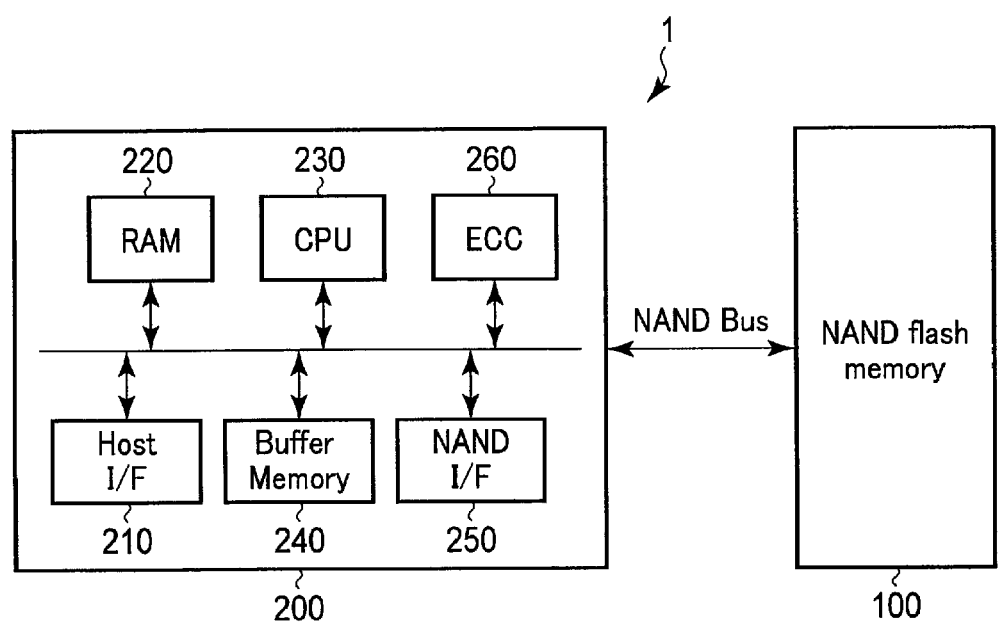
F I G. 1

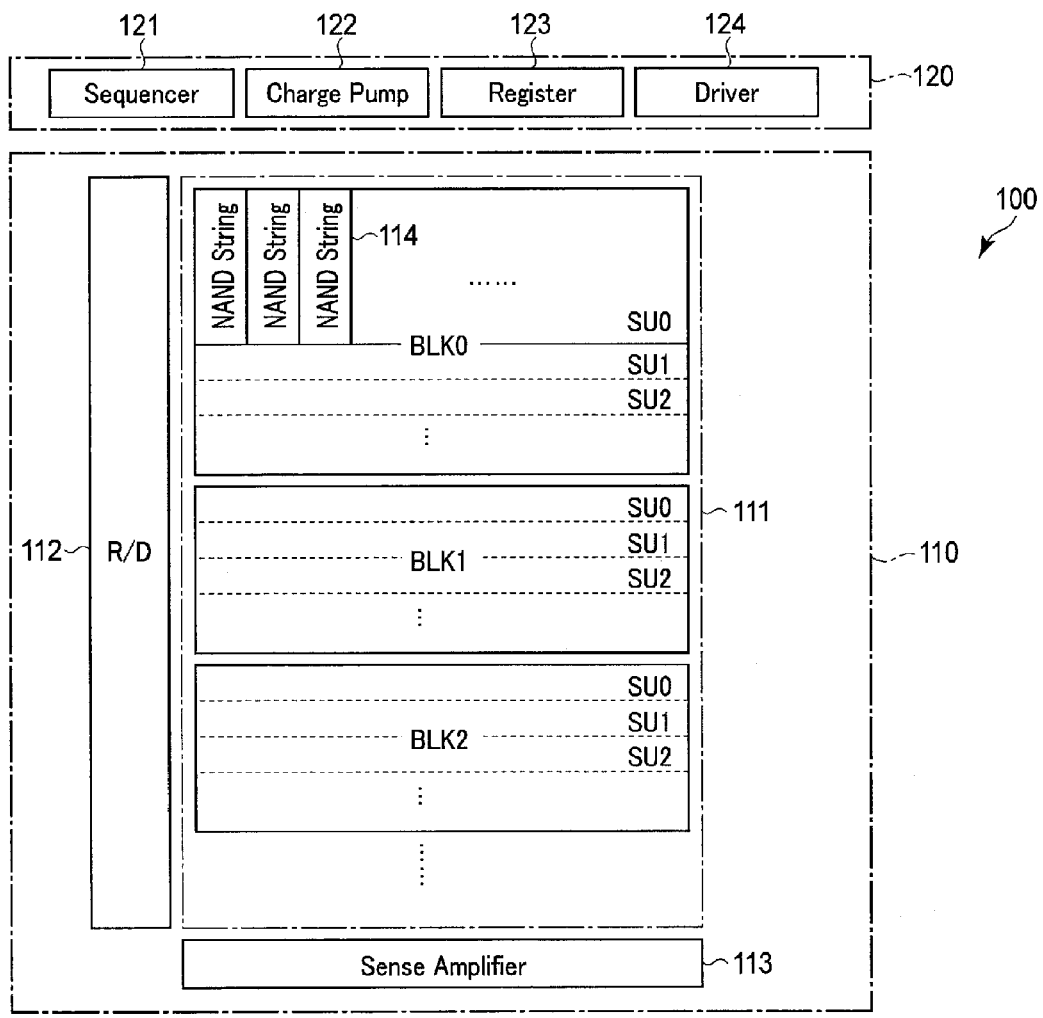
F I G. 2

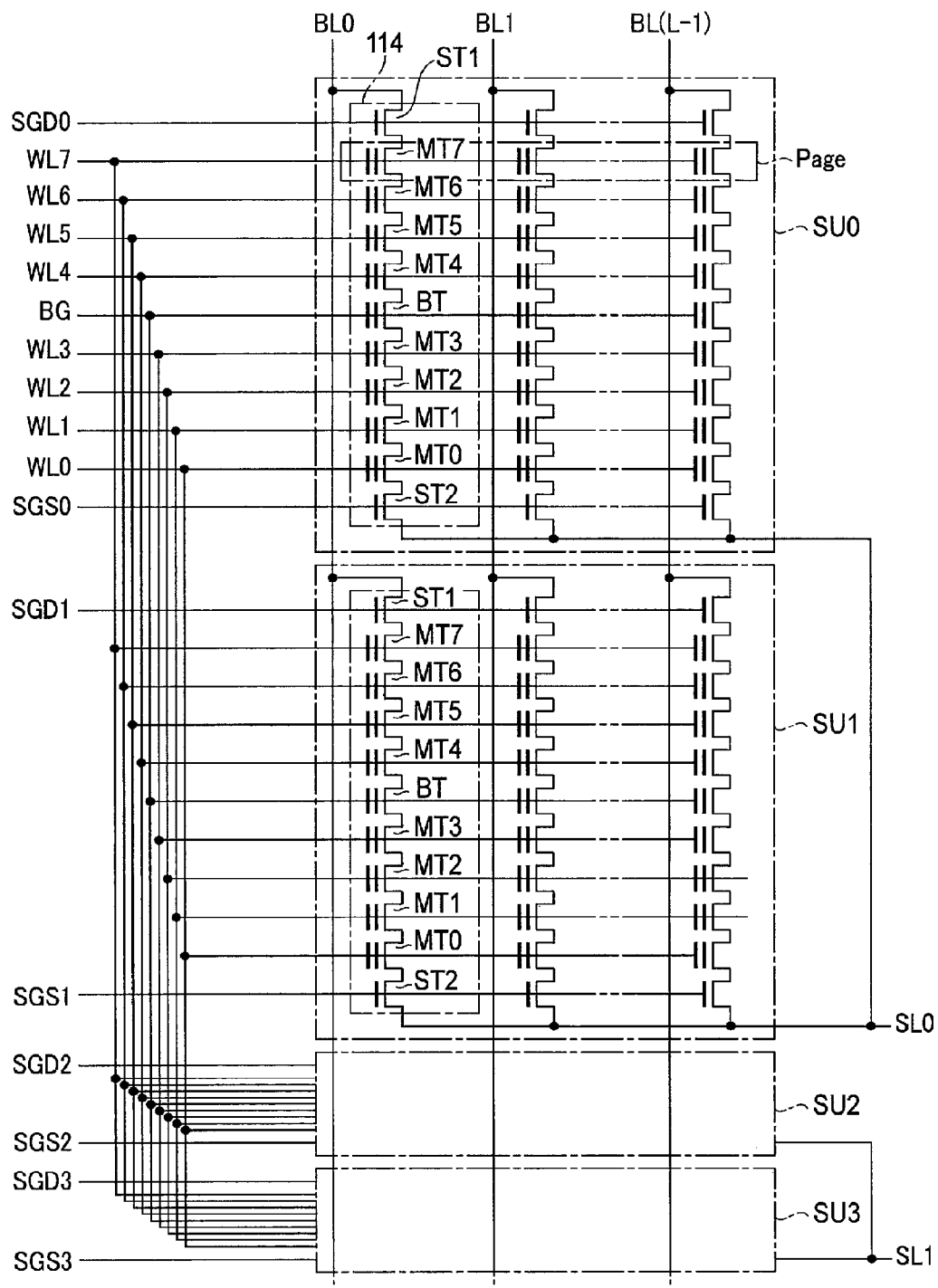
F I G. 3

|  |  | AR | BR | CR |
|---|---|---|---|---|
| 1st Retry Read | WL0, WL7 | Vshift_a0_1 | Vshift_b0_1 | Vshift_c0_1 |
|  | WL1, WL6 | Vshift_a1_1 | Vshift_b1_1 | Vshift_c1_1 |
|  | WL2, WL5 | Vshift_a2_1 | Vshift_b2_1 | Vshift_c2_1 |
|  | WL3, WL4 | Vshift_a3_1 | Vshift_b3_1 | Vshift_c3_1 |
| 2nd Retry Read | WL0, WL7 | Vshift_a0_2 | Vshift_b0_2 | Vshift_c0_2 |
|  | WL1, WL6 | Vshift_a1_2 | Vshift_b1_2 | Vshift_c1_2 |
|  | WL2, WL5 | Vshift_a2_2 | Vshift_b2_2 | Vshift_c2_2 |
|  | WL3, WL4 | Vshift_a3_2 | Vshift_b3_2 | Vshift_c3_2 |
| 3rd Retry Read | WL0, WL7 | Vshift_a0_3 | Vshift_b0_3 | Vshift_c0_3 |
|  | WL1, WL6 | Vshift_a1_3 | Vshift_b1_3 | Vshift_c1_3 |
|  | WL2, WL5 | Vshift_a2_3 | Vshift_b2_3 | Vshift_c2_3 |
|  | WL3, WL4 | Vshift_a3_3 | Vshift_b3_3 | Vshift_c3_3 |
|  | ⋮ | ⋮ | ⋮ | ⋮ |

F I G. 6

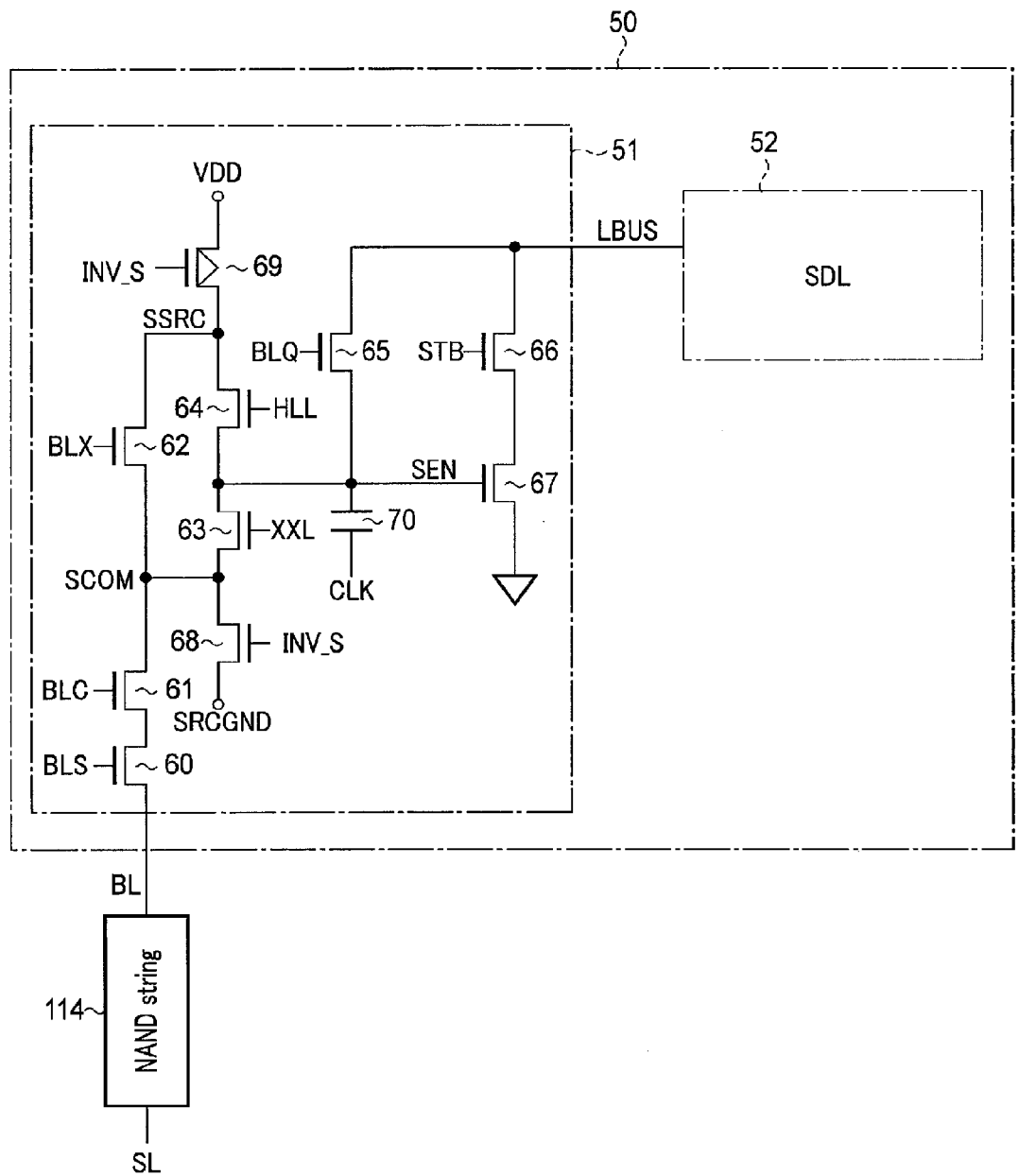
F I G. 7

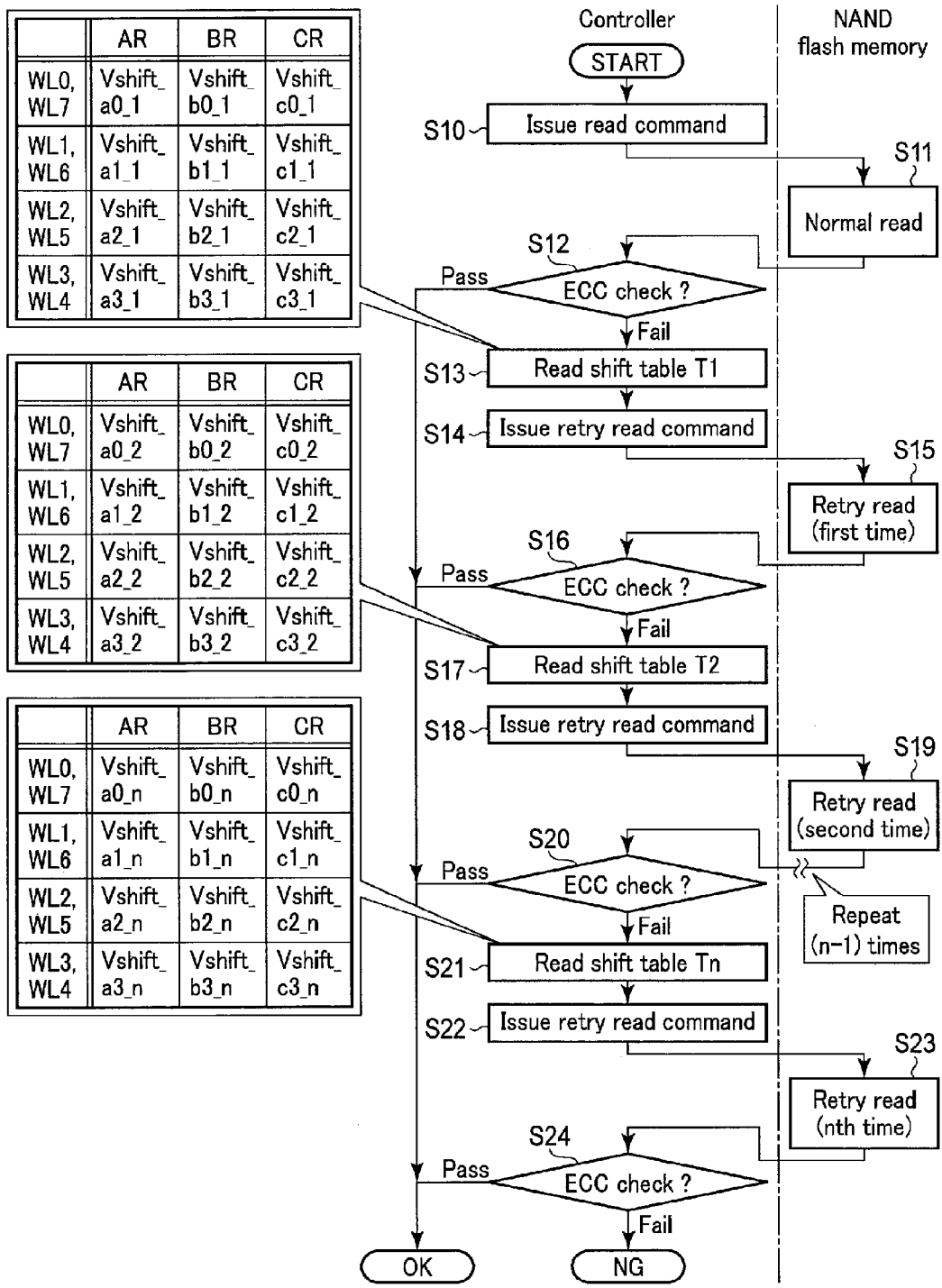
F I G. 9

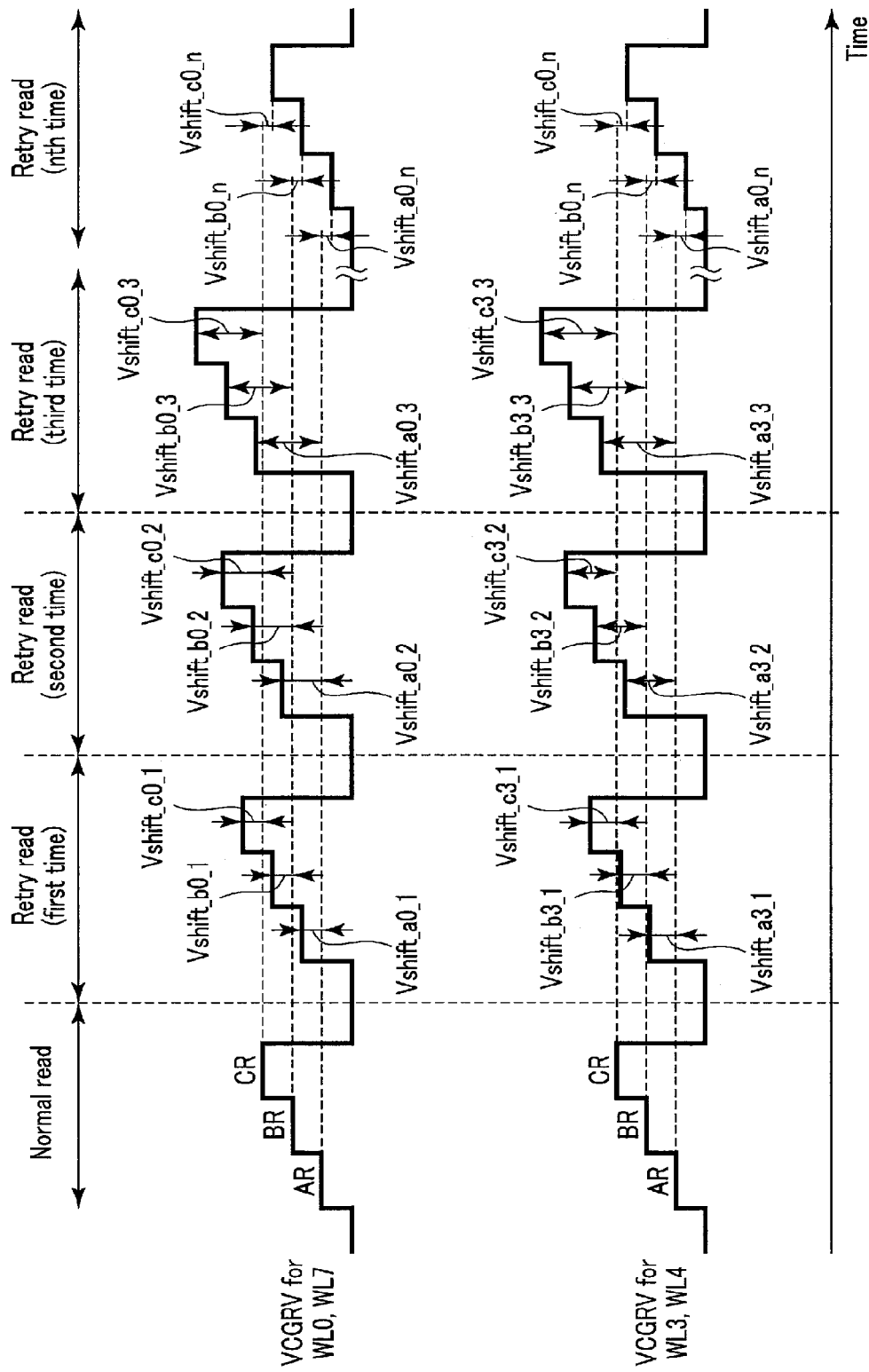
F I G. 10

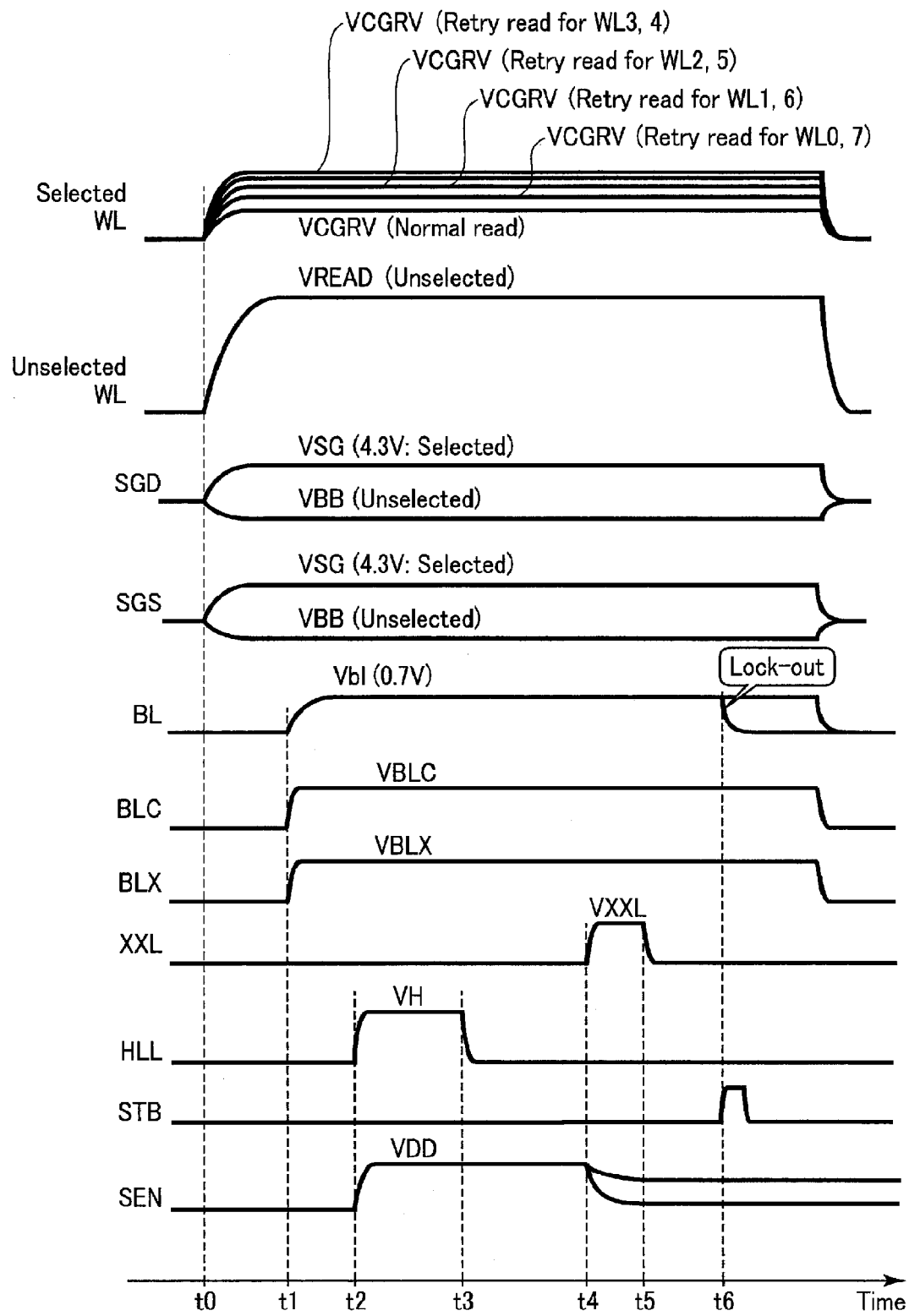
F I G. 11

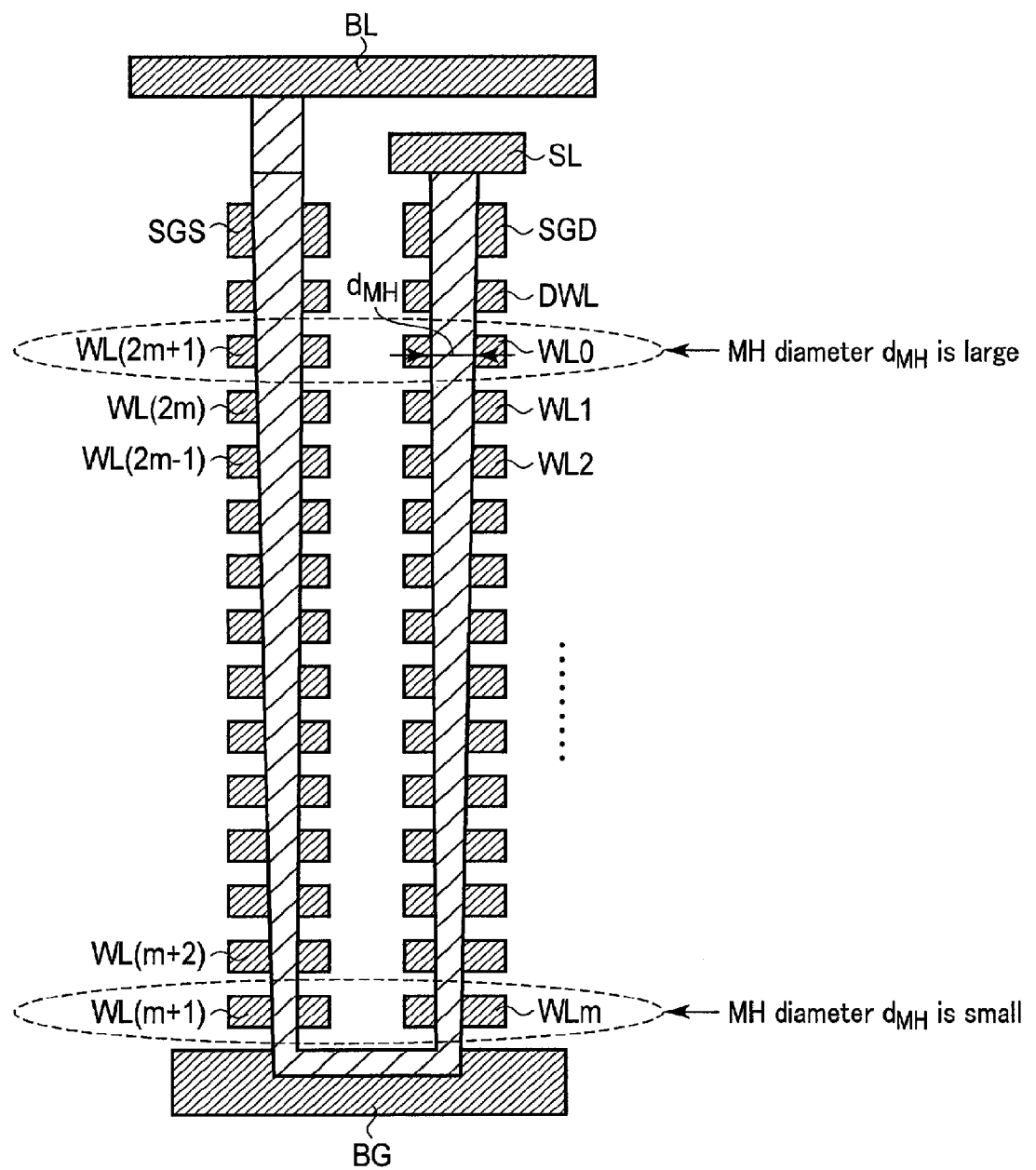
F I G. 12

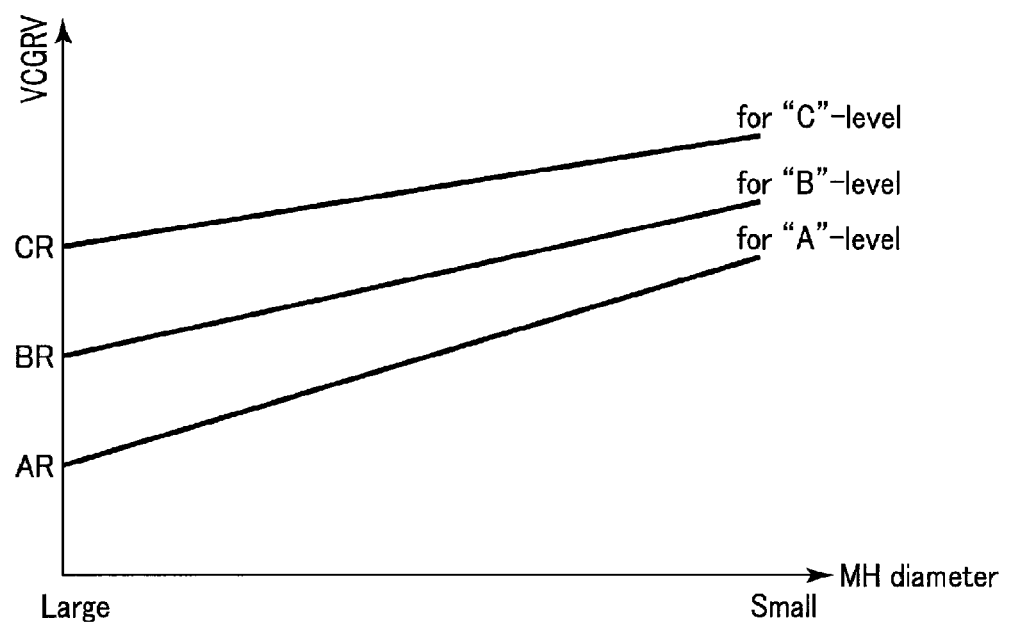
F I G. 14

|  |  | AR | BR | CR |
|---|---|---|---|---|
| Zone ZN1 | 1st Retry Read | Vshift_a0_1 | Vshift_b0_1 | Vshift_c0_1 |
|  | 2nd Retry Read | Vshift_a0_2 | Vshift_b0_2 | Vshift_c0_2 |
|  | ⋮ | ⋮ | ⋮ | ⋮ |
|  | n-th Retry Read | Vshift_a0_n | Vshift_b0_n | Vshift_c0_n |
| Zone ZN2 | 1st Retry Read | Vshift_a1_1 | Vshift_b1_1 | Vshift_c1_1 |
|  | 2nd Retry Read | Vshift_a1_2 | Vshift_b1_2 | Vshift_c1_2 |
|  | ⋮ | ⋮ | ⋮ | ⋮ |
|  | n-th Retry Read | Vshift_a1_n | Vshift_b1_n | Vshift_c1_n |
| Zone ZN3 | 1st Retry Read | Vshift_a2_1 | Vshift_b2_1 | Vshift_c2_1 |
|  | 2nd Retry Read | Vshift_a2_2 | Vshift_b2_2 | Vshift_c2_2 |
|  | ⋮ | ⋮ | ⋮ | ⋮ |
|  | n-th Retry Read | Vshift_a2_n | Vshift_b2_n | Vshift_c2_n |
|  | ⋮ | ⋮ | ⋮ | ⋮ |

F I G. 16

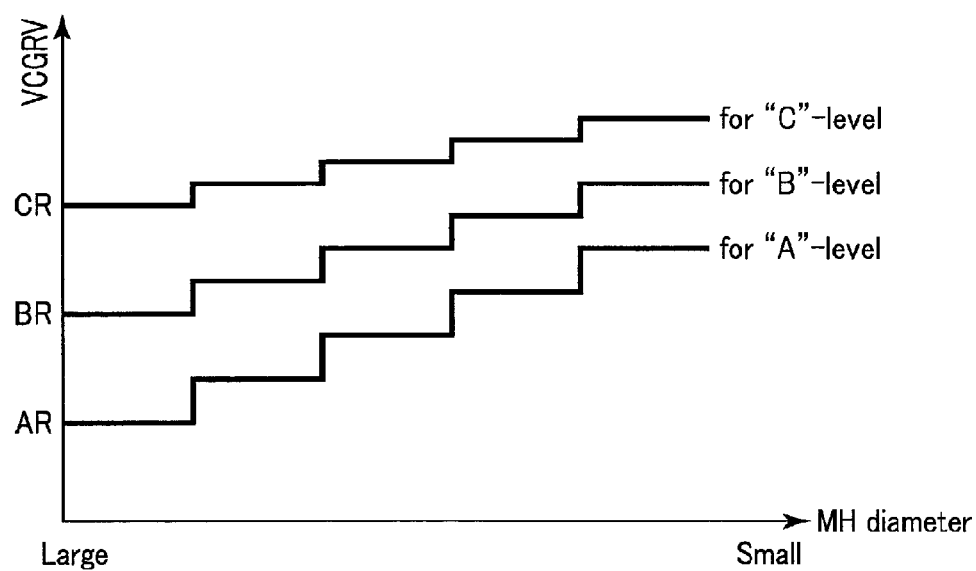

F I G. 17

|  |  | AR | BR | CR |
|---|---|---|---|---|
| 1st Retry Read | WL0 | Vshift_a0_1 | Vshift_b0_1 | Vshift_c0_1 |
| | WL1 | Vshift_a1_1 | Vshift_b1_1 | Vshift_c1_1 |
| | ⋮ | ⋮ | ⋮ | ⋮ |
| | WL7 | Vshift_a7_1 | Vshift_b7_n | Vshift_c7_n |
| 2nd Retry Read | WL0 | Vshift_a0_2 | Vshift_b0_2 | Vshift_c0_2 |
| | WL1 | Vshift_a1_2 | Vshift_b1_2 | Vshift_c1_2 |
| | ⋮ | ⋮ | ⋮ | ⋮ |
| | WL7 | Vshift_a7_2 | Vshift_b7_2 | Vshift_c7_2 |
| 3rd Retry Read | WL0 | Vshift_a0_3 | Vshift_b0_3 | Vshift_c0_3 |
| | WL1 | Vshift_a1_3 | Vshift_b1_3 | Vshift_c1_3 |
| | ⋮ | ⋮ | ⋮ | ⋮ |
| | WL7 | Vshift_a7_3 | Vshift_b7_3 | Vshift_c7_3 |
| ⋮ | | ⋮ | ⋮ | ⋮ |

F I G. 21

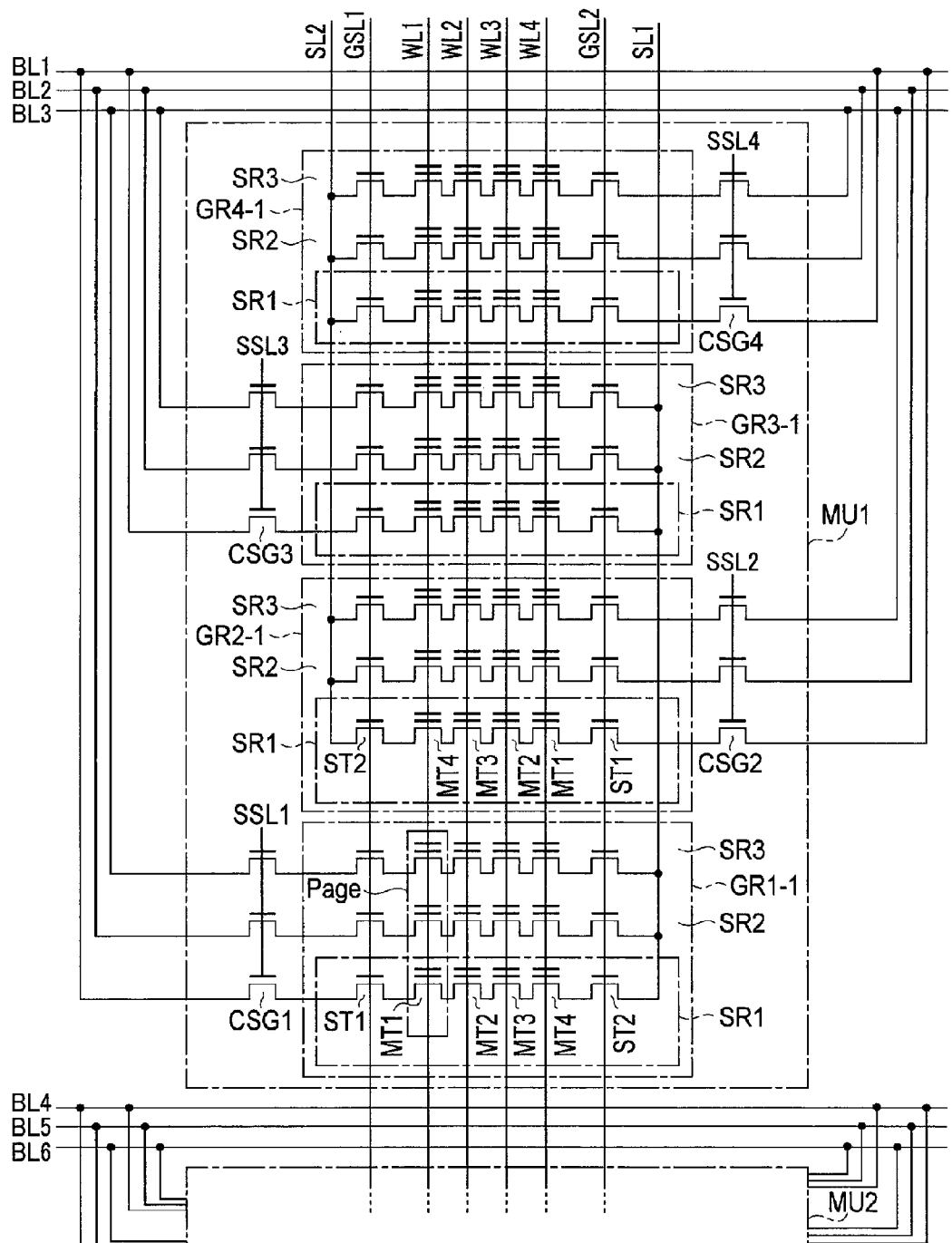
F I G. 22

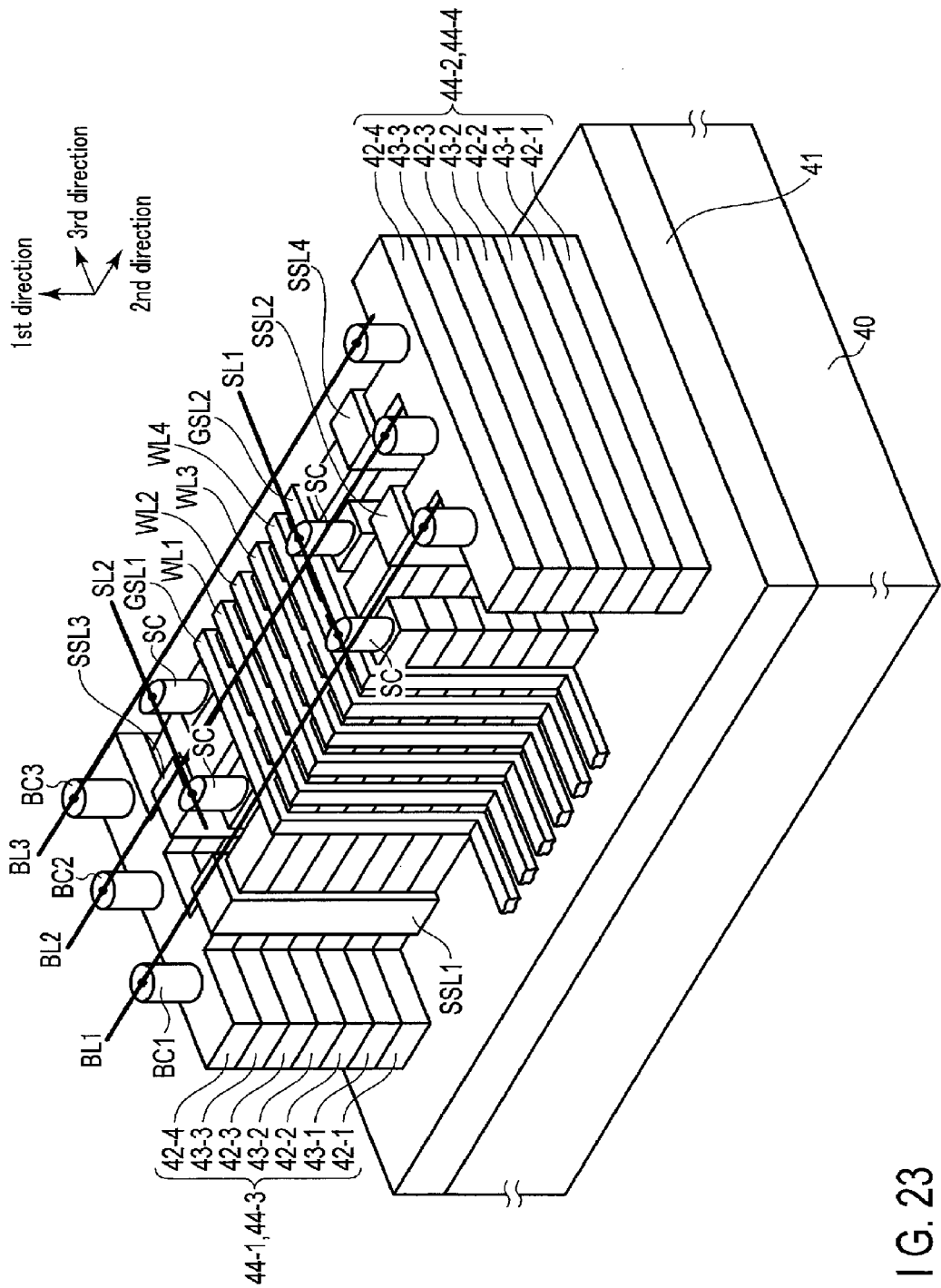
F I G. 23

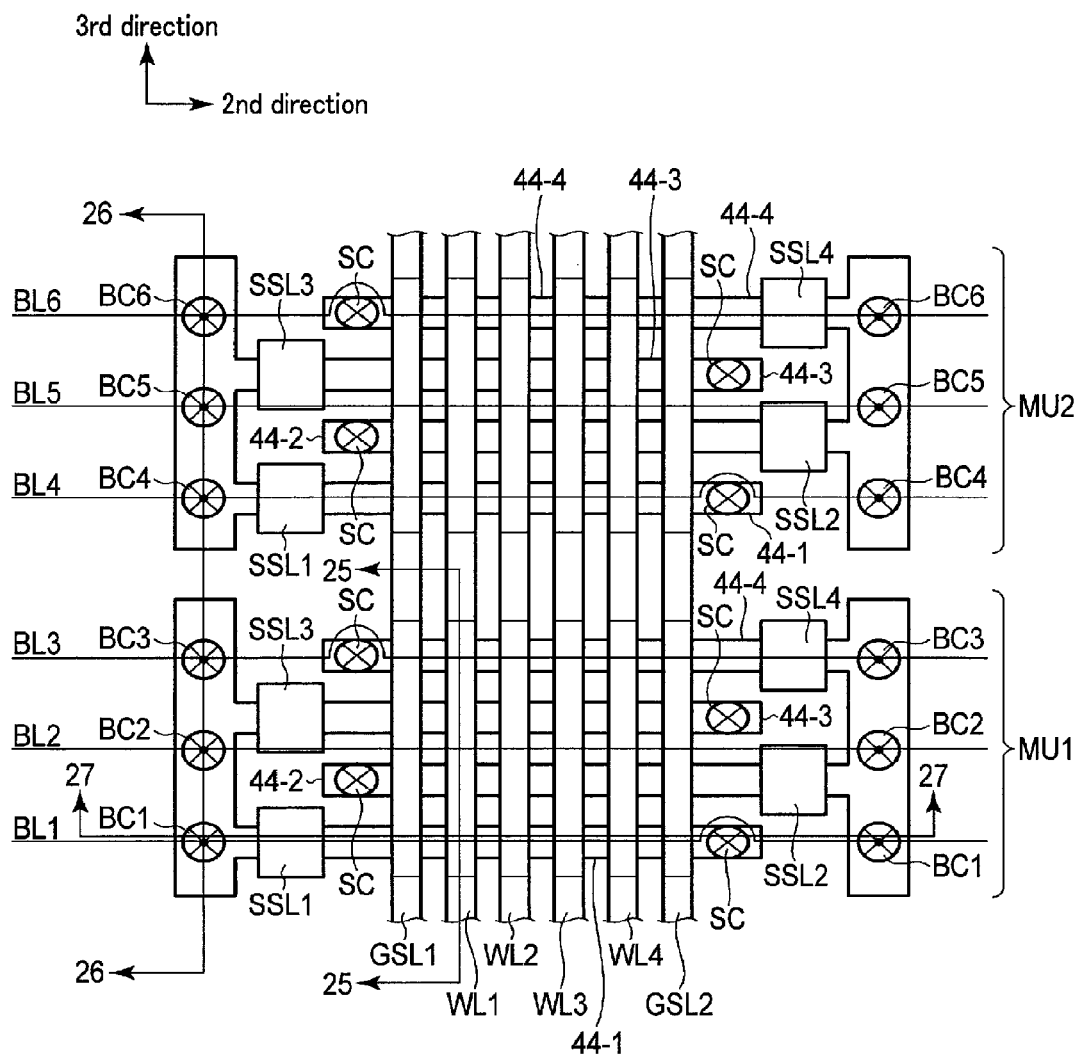
F I G. 24

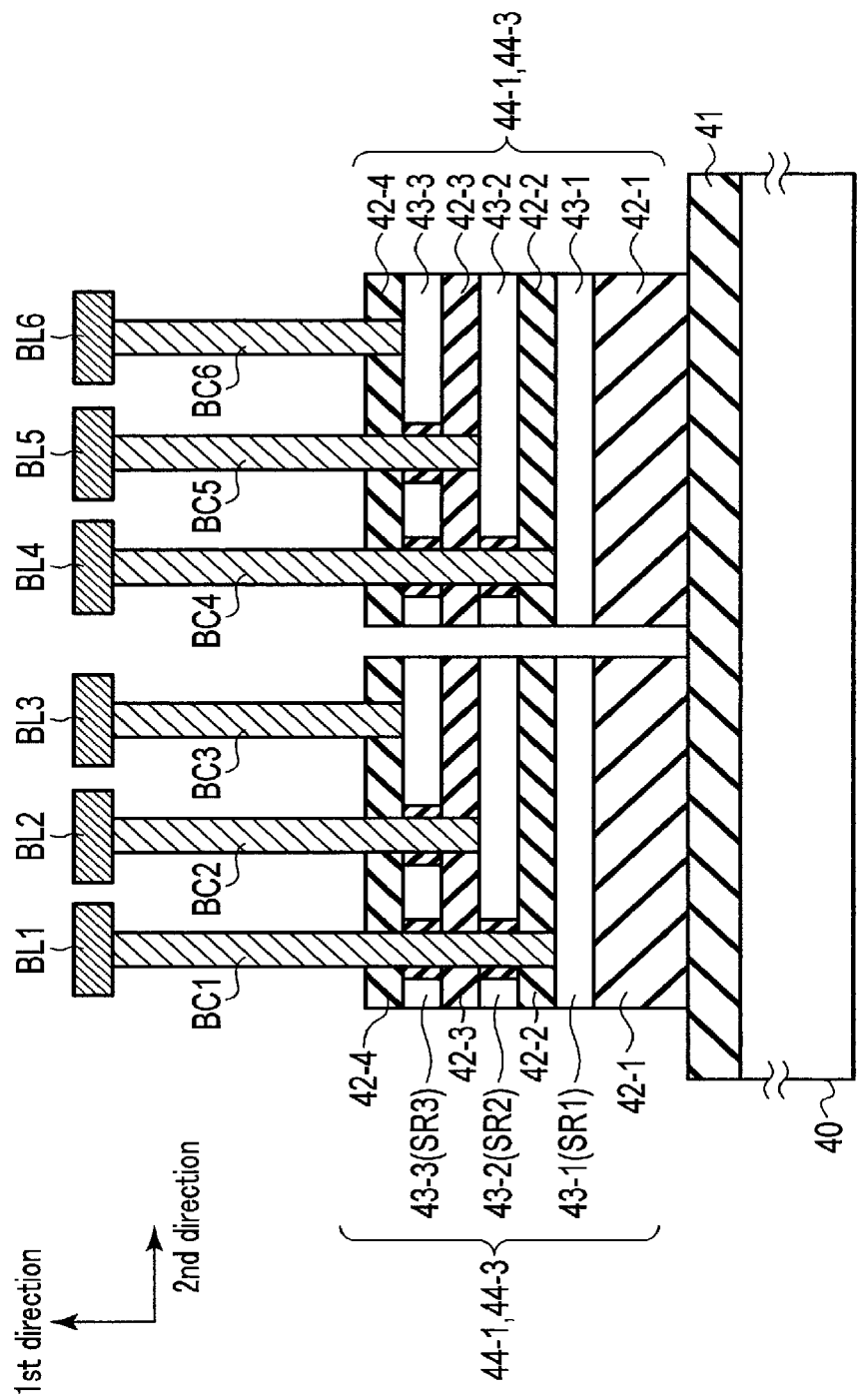
F I G. 26

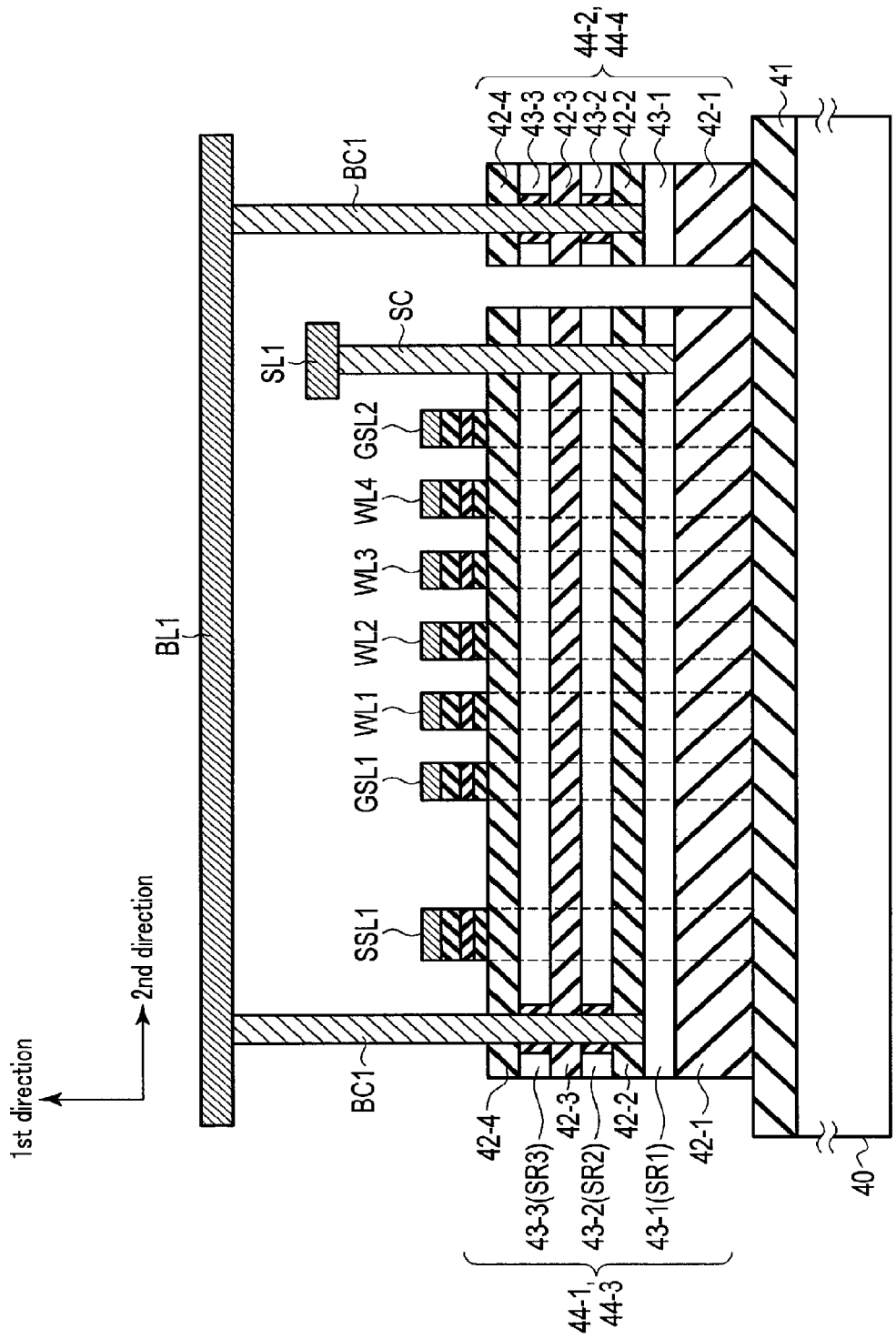
F I G. 27

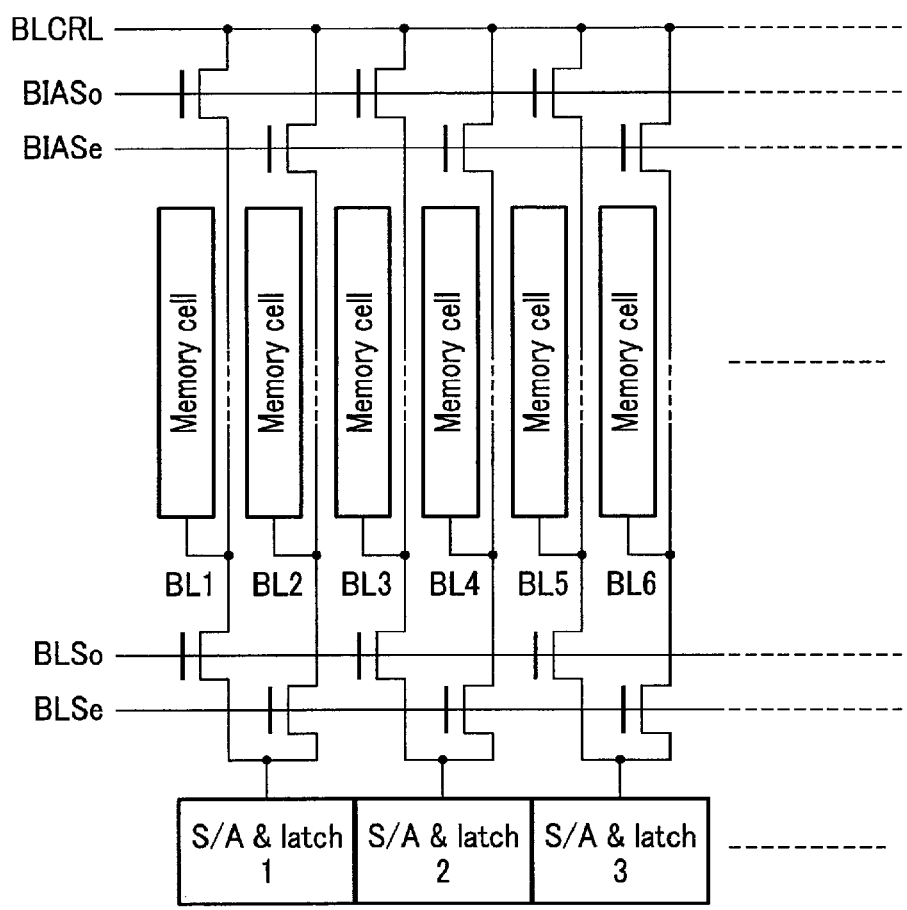
F I G. 28

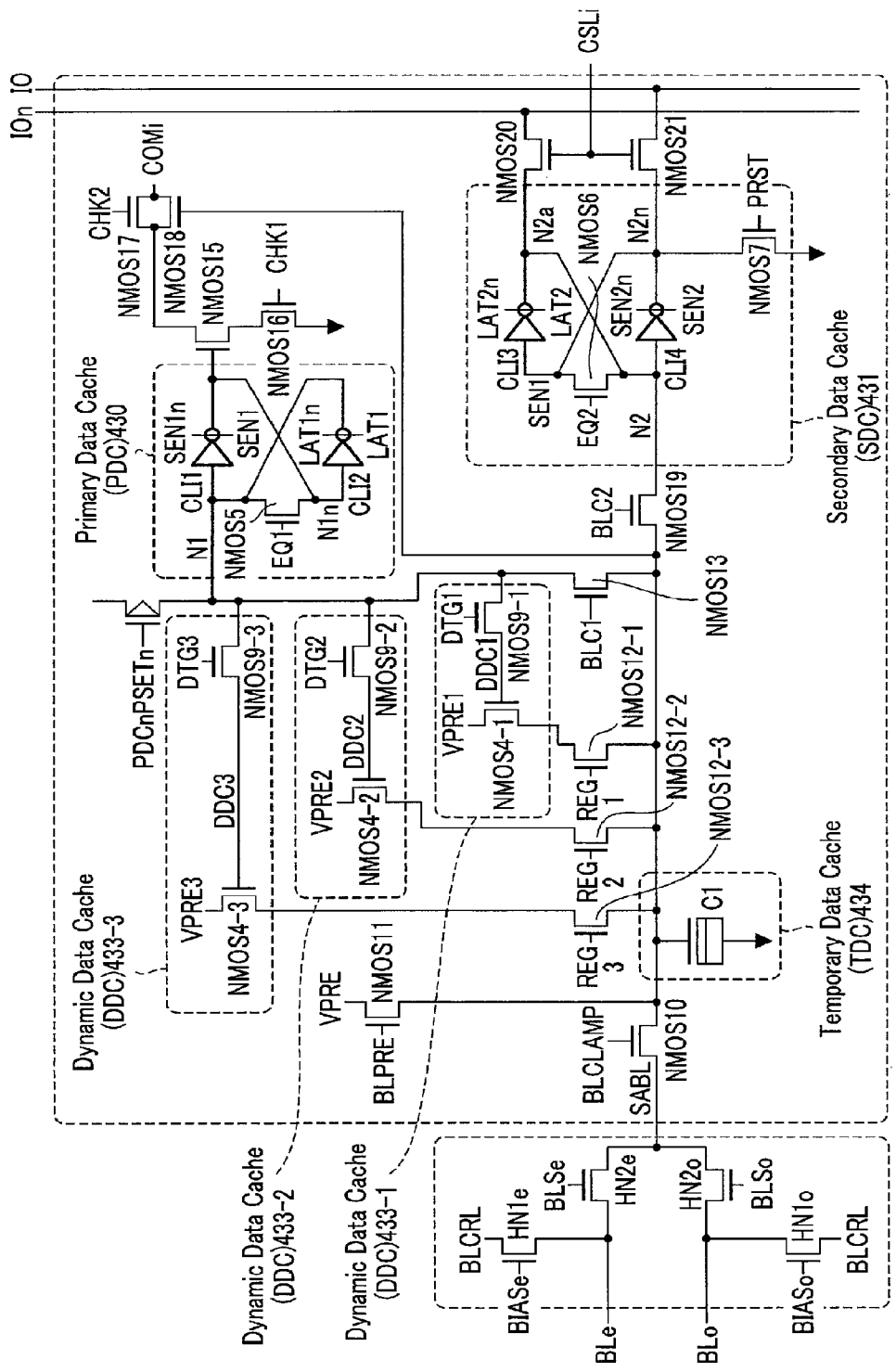
F I G. 29

|  |  | Vshift |
|---|---|---|
| 1st Retry Read | BL1, BL4 | Vshift_bot_1 |
|  | BL2, BL5 | Vshift_mid_1 |
|  | BL3, BL6 | Vshift_top_1 |
| 2nd Retry Read | BL1, BL4 | Vshift_bot_2 |
|  | BL2, BL5 | Vshift_mid_2 |
|  | BL3, BL6 | Vshift_top_2 |
| 3rd Retry Read | BL1, BL4 | Vshift_bot_3 |
|  | BL2, BL5 | Vshift_mid_3 |
|  | BL3, BL6 | Vshift_top_3 |
| ⋮ | | ⋮ |
F I G. 30
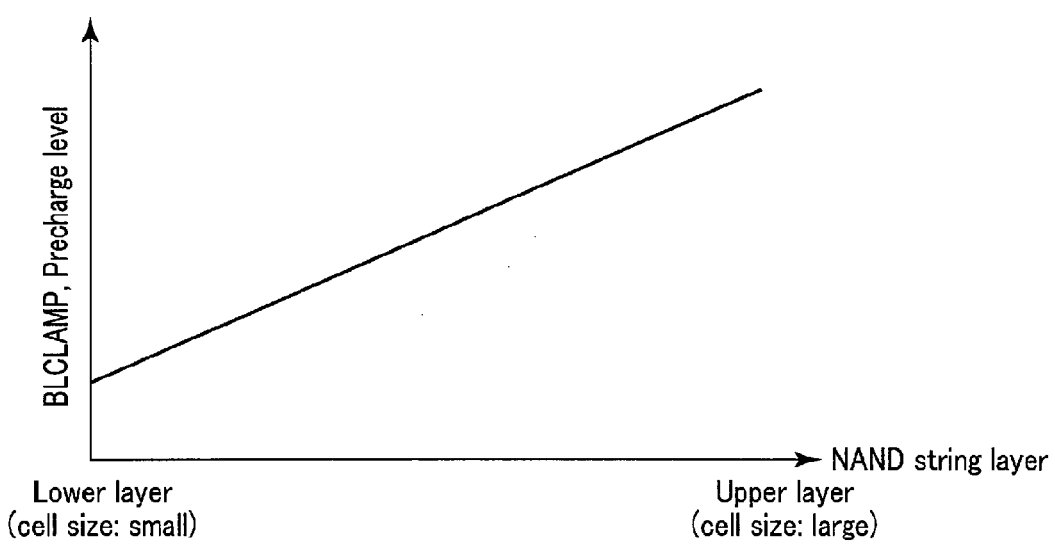
F I G. 31

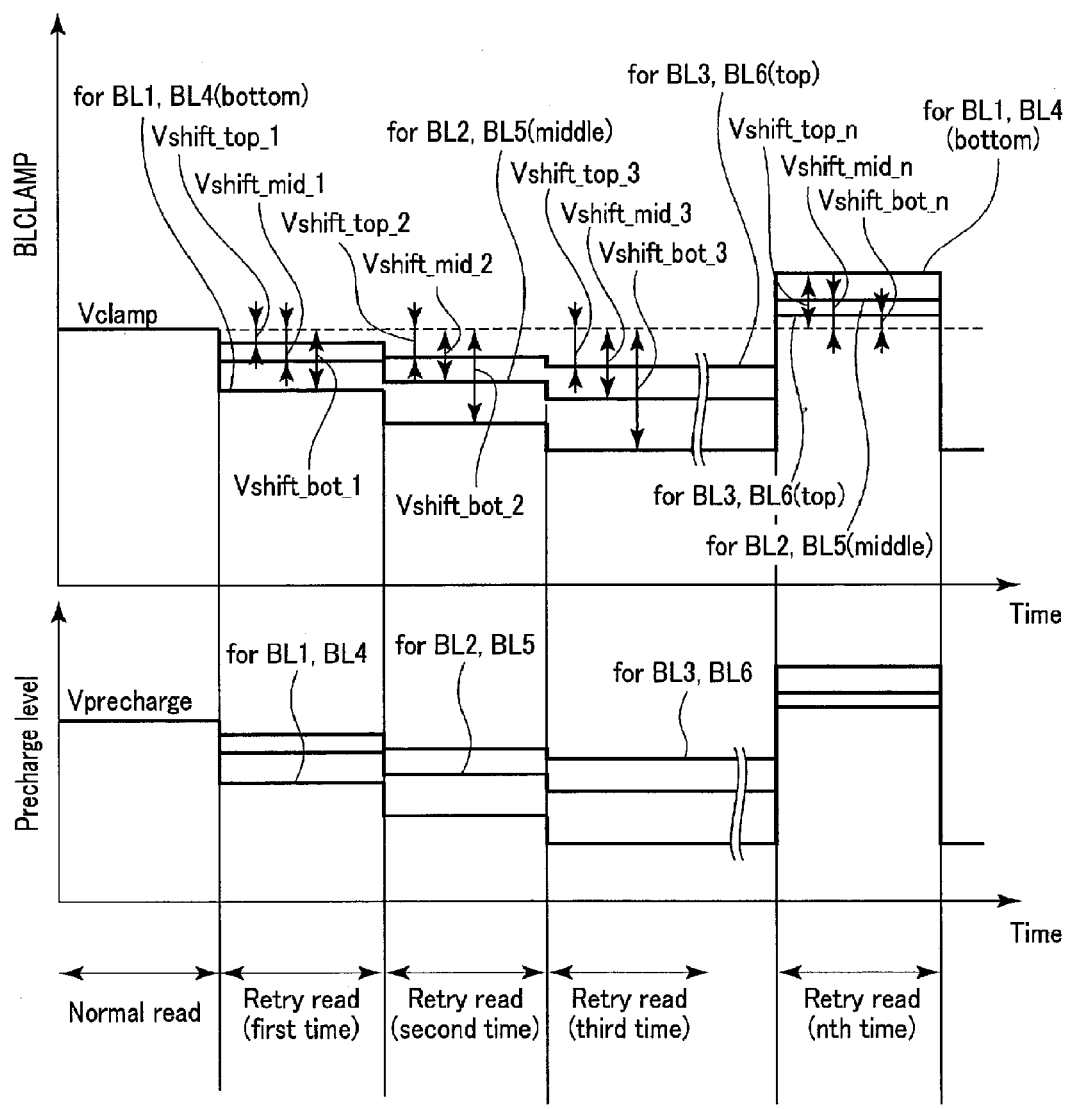
F I G. 32

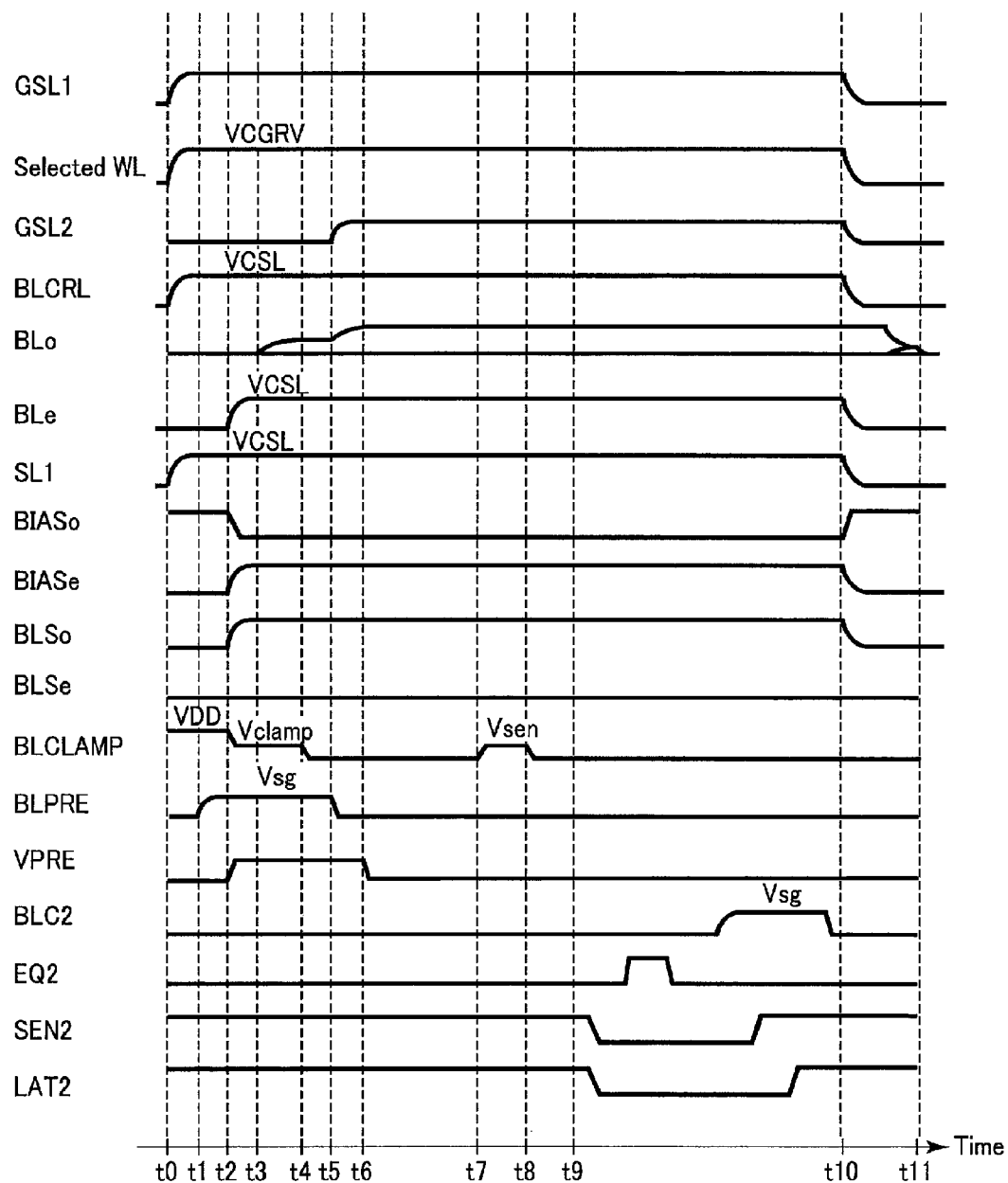
F I G. 34

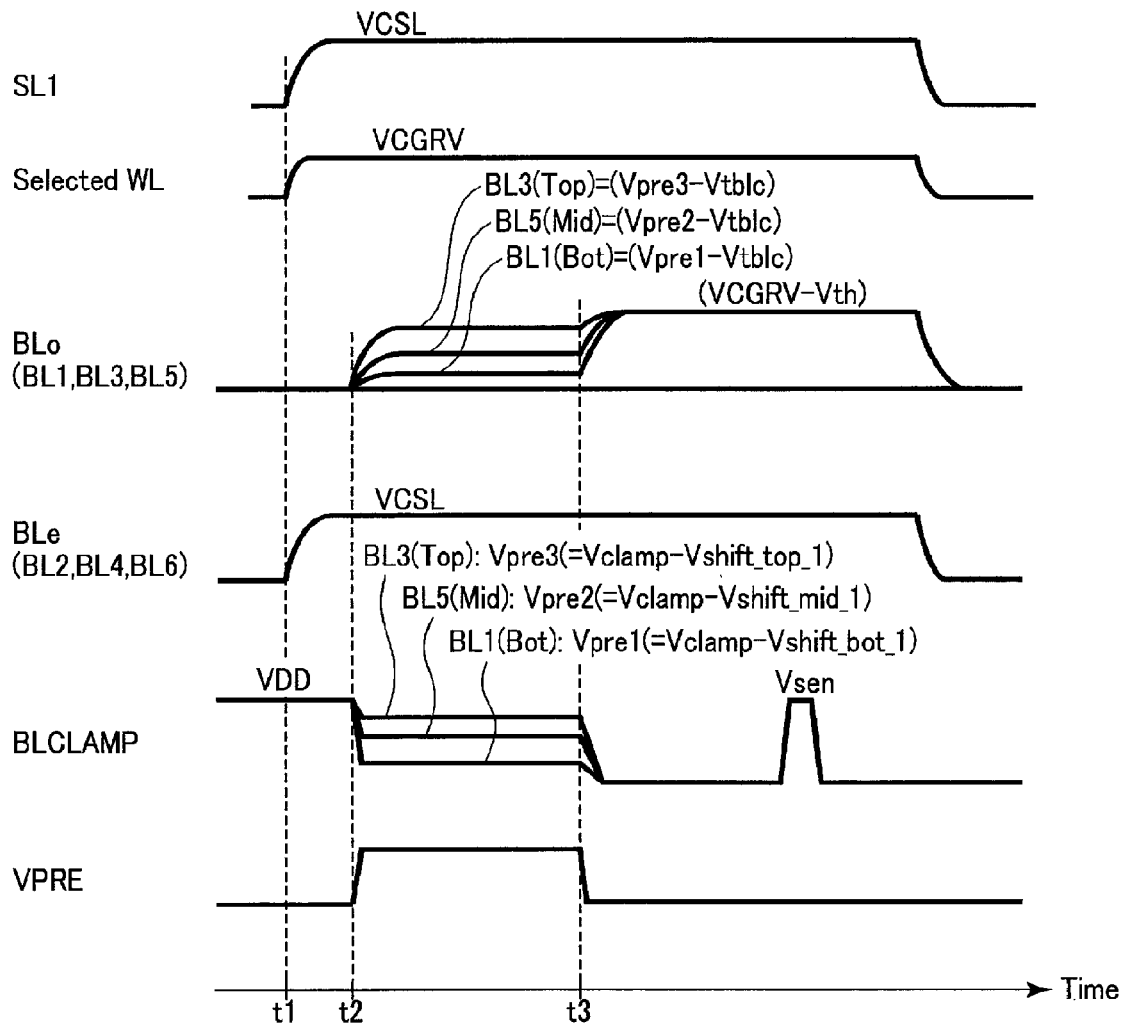
F I G. 35

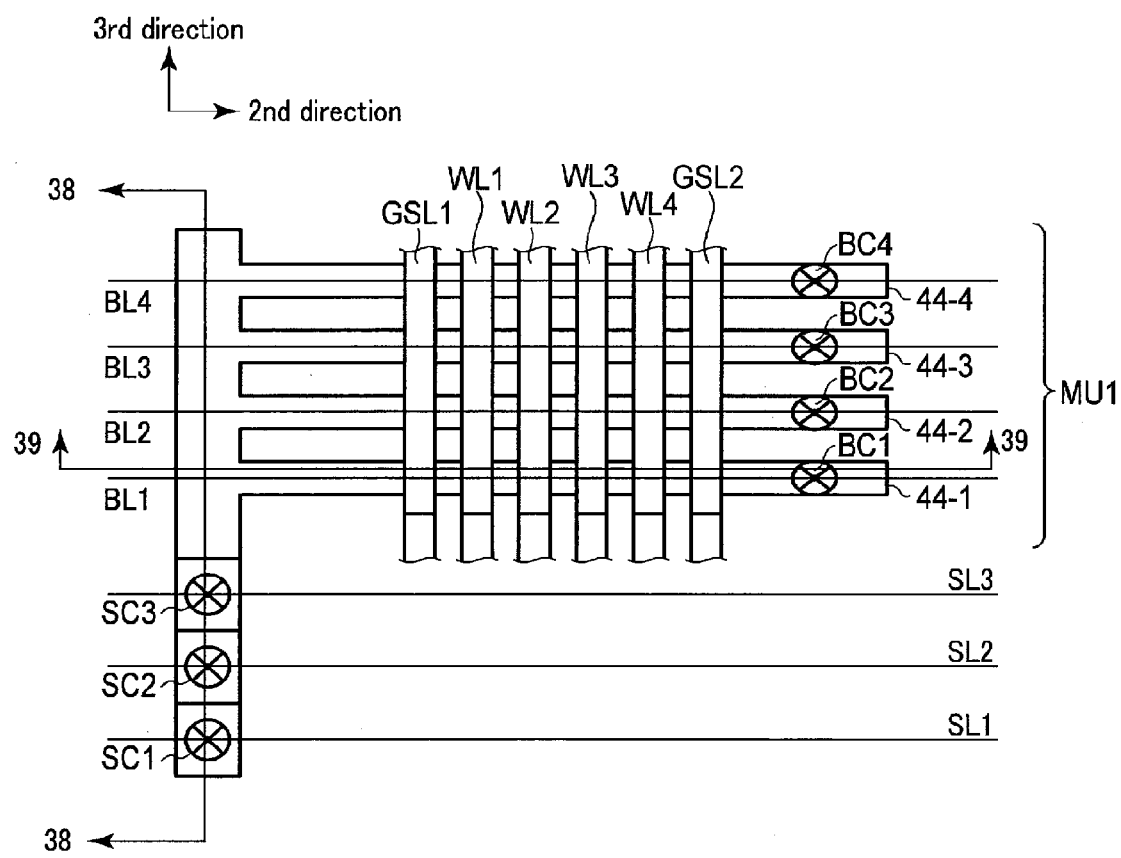
F I G. 37

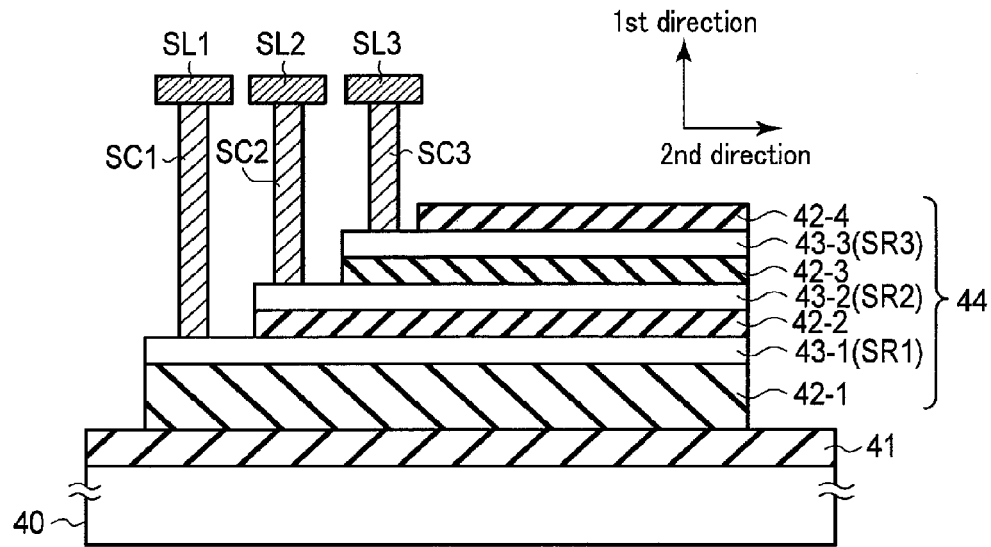
F I G. 38
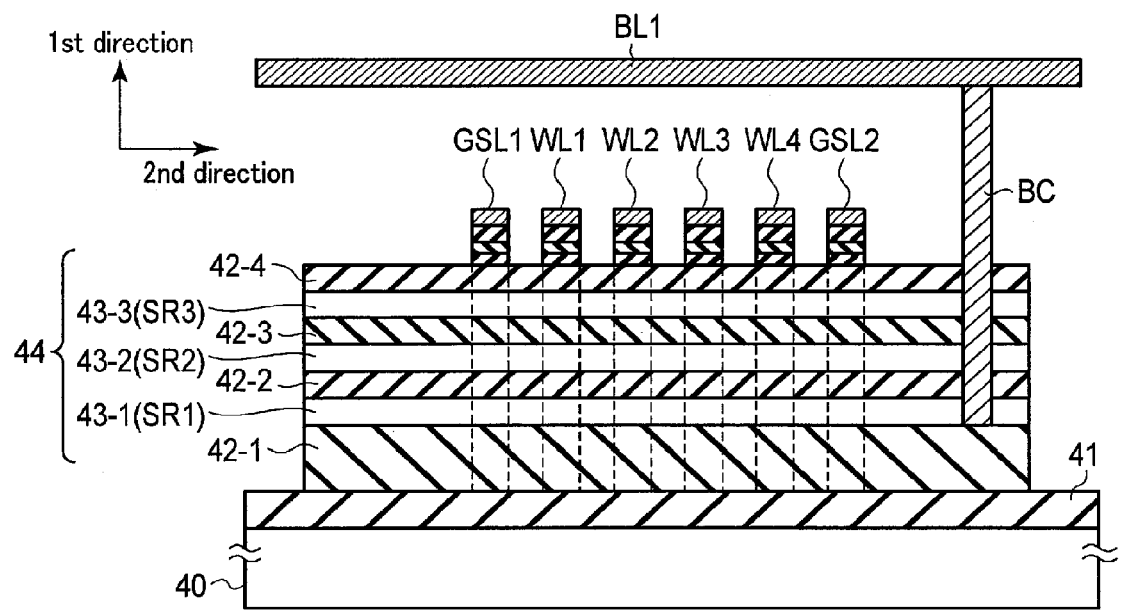
F I G. 39

SEMICONDUCTOR MEMORY DEVICE AND MEMORY SYSTEM

CROSS REFERENCE TO RELATED APPLICATIONS

This application is a Continuation Application of PCT Application No. PCT/JP2013/074952, filed Sep. 13, 2013, the entire contents of which are incorporated herein by reference.

FIELD

Embodiments described herein relate generally to a semiconductor memory device and a memory system.

BACKGROUND

There is known a NAND flash memory in which memory cells are three-dimensionally arranged.

BRIEF DESCRIPTION OF THE DRAWINGS

FIG. 1 is a block diagram of a memory system according to the first embodiment.

FIG. 2 is a block diagram of a semiconductor memory device according to the first embodiment.

FIG. 3 and FIG. 4 are circuit diagram and sectional view of a memory cell array according to the first embodiment.

FIG. 6 is a conceptual view of a shift table according to the first embodiment.

FIG. 7 and FIG. 8 are circuit diagram of a sense amplifier and the memory cell array according to the first embodiment.

FIG. 9 is a flowchart showing a data reading method according to the first embodiment.

FIG. 10 is a timing chart showing a change in a word line potential in data reading according to the first embodiment.

FIG. 11 is a timing chart of various kinds of signals in data reading according to the first embodiment.

FIG. 12 is a sectional view of a NAND string.

FIG. 14 is a graph showing the relationship between a read voltage and a memory hole diameter according to the first embodiment.

FIG. 16 is a conceptual view of a shift table according to the second embodiment.

FIG. 17 is a graph showing the relationship between a read voltage and a memory hole diameter according to the second embodiment.

FIG. 21 is a conceptual view of a shift table according to the fourth embodiment.

FIG. 22 is a circuit diagram of a memory cell array according to the fifth embodiment.

FIG. 23 and FIG. 24 are perspective and plan views of the memory cell array according to the fifth embodiment.

FIG. 25, FIG. 26, and FIG. 27 are sectional views taken along lines 25-25, 26-26, and 27-27 in FIG. 24.

FIG. 28 is a block diagram of a semiconductor memory device according to the fifth embodiment.

FIG. 29 is a circuit diagram of a sense circuit according to the fifth embodiment.

FIG. 30 is a conceptual view of a shift table according to the fifth embodiment.

FIG. 31 is a graph showing the relationship between a bit line voltage and a memory hole diameter according to the fifth embodiment.

FIG. 32 is a timing chart showing changes in a clamp voltage and a precharge potential in data reading according to the fifth embodiment.

FIG. 34 and FIG. 35 are timing charts of various kinds of signals in normal data reading and retry reading according to the fifth embodiment.

FIG. 36 and FIG. 37 are perspective and plan views of a memory cell array according to the sixth embodiment.

FIG. 38 and FIG. 39 are sectional views taken along lines 38-38 and 39-39 in FIG. 37.

DETAILED DESCRIPTION

Figure 4:
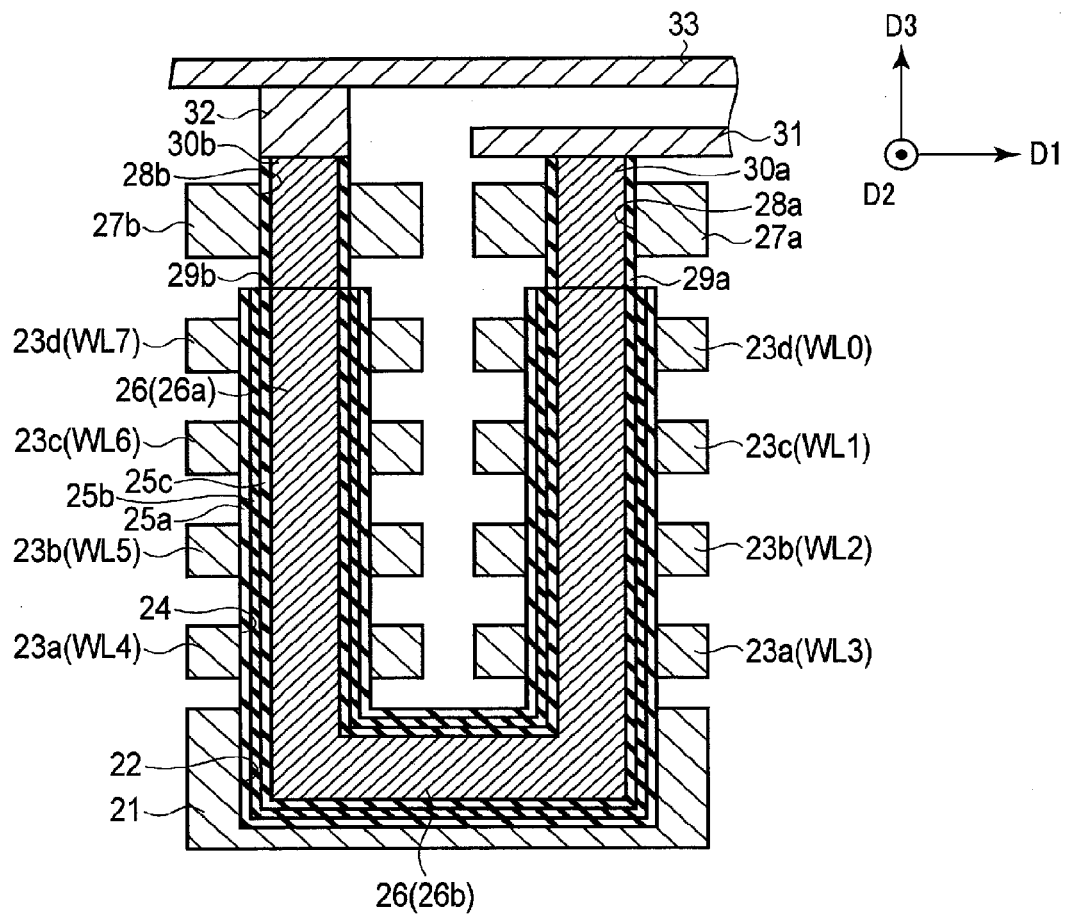

In general, according to one embodiment, a semiconductor memory device includes: a first memory cell provided above a semiconductor substrate; a second memory cell stacked above the first memory cell; a word line electrically connected to gates of the first memory cell and the second memory cell; a first bit line electrically connected to one end of the first memory cell; and a second bit line electrically connected to one end of the second memory cell. In data reading, a first read voltage is applied to the word line. In retry reading, a second read voltage is applied to the word line, and a voltage applied to the first bit line is different from a voltage applied to the second bit line.

1. First Embodiment

A semiconductor memory device according to the first embodiment will be described. A 3D-stacked NAND flash memory in which memory cells are stacked above a semiconductor substrate will be exemplified below as the semiconductor memory device.

1.1 Arrangement 1.1.1 Arrangement of Memory System

The arrangement of a memory system including the semiconductor memory device according to this embodiment will be described first with reference to FIG. 1. FIG. 1 is a block diagram of the memory system according to this embodiment.

As shown in FIG. 1, the memory system includes a NAND flash memory 100 and a controller 200. The controller 200 and the NAND flash memory 100 may form, for example, one semiconductor device in combination. Examples are a memory card such as an SD™ card and an SSD (Solid State Drive).

The NAND flash memory 100 includes a plurality of memory cells and nonvolatilely stores data. Details of the arrangement of the NAND flash memory 100 will be described later.

In response to an instruction from an external host device, the controller 200 instructs the NAND flash memory 100 to read, write, erase, or the like. The controller 200 also manages the memory space of the NAND flash memory 100.

The controller 200 includes a host interface circuit 210, an internal memory (RAM) 220, a processor (CPU) 230, a buffer memory 240, a NAND interface circuit 250, and an ECC circuit 260.

The host interface circuit 210 is connected to the host device via a controller bus, and controls communication with the host device. The host interface circuit 210 transfers an instruction and data received from the host device to the CPU 230 and the buffer memory 240. Additionally, in response to an instruction from CPU 230, the host interface circuit 210 transfers data in the buffer memory 240 to the host device.

The NAND interface circuit 250 is connected to the NAND flash memory 100 via a NAND bus, and controls communication with the NAND flash memory 100. The NAND interface circuit 250 transfers an instruction received from the CPU 230 to the NAND flash memory 100. At the time of write, the NAND interface circuit 250 transfers write data in the buffer memory 240 to the NAND flash memory 100. At the time of read, the NAND interface circuit 250 transfers data read from the NAND flash memory 100 to the buffer memory 240.

The CPU 230 controls the operation of the entire controller 200. For example, upon receiving a write/read instruction from the host device, the CPU 230 issues a write instruction based on the NAND interface in response to it. This also applies to read and erase. The CPU 230 also executes various kinds of processing such as wear leveling to manage the NAND flash memory 100. In addition, the CPU 230 executes various kinds of operations. For example, the CPU 230 executes encryption processing, randomization processing, and the like for data.

The ECC circuit 260 executes ECC (Error Checking and Correcting) processing for data. That is, in data writing, the ECC circuit 260 generates a parity based on write data. In data reading, the ECC circuit 260 generates a syndrome from the parity, detects an error, and corrects it. Note that the CPU 230 may have the function of the ECC circuit 260.

The internal memory 220 is a semiconductor memory such as a DRAM, and is used as the work area of the CPU 230. The internal memory 220 stores firmware to manage the NAND flash memory 1, various kinds of management tables, and the like. The internal memory 220 according to this embodiment stores a shift table. The shift table is a table representing the offset of a read voltage used in data reading. The shift table will be described later in detail in section 1.1.3.

1.1.2 Arrangement of Semiconductor Memory Device

The arrangement of the semiconductor memory device 100 will be described next.

1.1.2.1 Overall Arrangement of Semiconductor Memory Device

FIG. 2 is a block diagram of the NAND flash memory 100 according to this embodiment. As shown in FIG. 2, the NAND flash memory 100 mainly includes a core portion 110 and a peripheral circuit 120.

The core portion 110 includes a memory cell array 111, a row decoder 112, and a sense amplifier 113.

The memory cell array 111 includes a plurality of (three, in the example of FIG. 2) blocks BLK (BLK0 to BLK2) each of which is a set of a plurality of memory cells associated will word lines and bit lines. The block BLK is a data erase unit. Data in the same block BLK are erased at once. Each block BLK includes a plurality of string units SU (SU0 to SU3) each of which is a set of NAND strings 114 each including memory cells connected in series. The number of blocks in the memory cell array 111 and the number of string groups in one block BLK are arbitrary, as a matter of course.

The row decoder 112 decodes a block address or a page address, and selects a word line of a corresponding block. The row decoder 112 applies appropriate voltages to the selected word line and unselected word lines.

In data reading, the sense amplifier 113 senses/amplifies data read from a memory cell to a bit line. In data writing, the sense amplifier 113 transfers write data to a memory cell. Data reading and data writing for the memory cell array 111 are performed on a basis of a plurality of memory cells, and this unit serves as a page.

The peripheral circuit 120 includes a sequencer 121, a charge pump 122, a register 123, and a driver 124.

The driver 124 supplies voltages necessary for writing, reading, and erasing data to the row decoder 112, the sense amplifier 113, and a source line driver (not shown). These voltages are applied to the memory cells (word lines, selection gate lines, back gate lines, bit lines, and source lines to be described later) by the row decoder 112, the sense amplifier 113, and the source line driver.

The charge pump 122 boosts an externally given power supply voltage and supplies a necessary voltage to the driver 124.

The register 123 holds various signals. For example, the register 123 holds the status of data writing or erasing operation, and thus notifies the controller whether the operation is normally completed. The register 123 can also hold various tables.

The sequencer 121 controls the operation of the entire NAND flash memory 100.

1.1.2.2 Memory Cell Array 111

Details of the arrangement of the memory cell array 111 will be described next. FIG. 3 is a circuit diagram of the block BLK0. The remaining blocks BLK have the same arrangement.

As shown in FIG. 3, the block BLK0 includes, for example, four string units SU. Each string unit SU includes a plurality of NAND strings 114.

Each NAND string 114 includes, for example, eight memory cell transistors MT (MT0 to MT7), selection transistors ST1 and ST2, and a back gate transistor BT. Each memory cell transistor MT includes a stacked gate including a control gate and a charge accumulation layer, and nonvolatilely holds data. Note that the number of memory cell transistors MT is not limited to eight. The number is not limited to eight, and may be 16, 32, 64, or 128. The back gate transistor BT also includes a stacked gate including a control gate and a charge accumulation layer, like the memory cell transistor MT. However, the back gate transistor BT is not used for storing data, and functions as a mere current path in data writing, reading, and erasing. The memory cell transistors MT and the back gate transistor BT are arranged between the selection transistors ST1 and ST2 such that the current paths are connected in series. Note that the back gate transistor BT is provided between the memory cell transistors MT3 and MT4. The current path of the memory cell transistor MT7 on one-end side of the series connection is connected to one end of the current path of the selection transistor ST1. The current path of the memory cell transistor MT0 on the other-end side is connected to one end of the current path of the selection transistor ST2.

The gates of the selection transistors ST1 in the string units SU0 to SU3 are commonly connected to selection gate lines SGD0 to SGD3. The gates of the selection transistors ST2 are commonly connected to selection gate lines SGS0 to SGS3. On the other hand, the control gates of the memory cell transistors MT0 to MT7 in the same block BLK0 are commonly connected to word lines WL0 to WL7. The control gates of the back gate transistors BT are commonly connected to a back gate line BG (BG0 to BG2 in the blocks BLK0 to BLK2).

That is, the word lines WL0 to WL7 and the back gate line BG are commonly connected among the plurality of string units SU0 to SU3 in the same block BLK0. On the other hand, the selection gate lines SGD and SGS are independently provided for each of the string units SU0 to SU3 even in the same block BLK0.

In addition, the other ends of the current paths of the selection transistors ST1 of the NAND strings 114 on the same column of the NAND strings 114 arranged in a matrix in the memory cell array 111 are commonly connected to one of bit lines BL (BL0 to BL(L−1), (L−1) is a natural number, (L−1)≥1). That is, each bit line BL commonly connects the NAND strings 114 among the plurality of blocks BLK. The other-ends of the current paths of the selection transistors ST2 are commonly connected to a source line SL. The source line SL commonly connects the NAND strings 114, for example, among the plurality of blocks.

As described above, data of the memory cell transistors MT in the same block BLK are erased at once. On the other hand, data reading and writing are performed at once for a plurality of memory cell transistors MT commonly connected to one word line WL in one string unit SU in one block BLK. This unit is called "page".

The arrangement of the memory cell array 111 is described in, for example, U.S. patent application Ser. No. 12/407,403 "THREE DIMENSIONAL STACKED NON-VOLATILE SEMICONDUCTOR MEMORY" filed Mar. 19, 2009. The arrangement is also described in U.S. patent application Ser. No. 12/406,524 "THREE DIMENSIONAL STACKED NONVOLATILE SEMICONDUCTOR MEMORY" filed Mar. 18, 2009, U.S. patent application Ser. No. 12/679,991 "NON-VOLATILE SEMICONDUCTOR STORAGE DEVICE AND METHOD OF MANUFACTURING THE SAME" filed Mar. 25, 2010, and U.S. patent application Ser. No. 12/532,030 "SEMICONDUCTOR MEMORY AND METHOD FOR MANUFACTURING THE SAME" filed Mar. 23, 2009. The entire contents of the patent applications are incorporated by reference in this specification.

An example of the arrangement of the memory cell array 111 will briefly be described with reference to FIG. 4. FIG. 4 is a sectional view of the NAND string 114. A plurality of structures shown in FIG. 4 are arranged in the depth direction (D2) of the sheet of FIG. 4 and share the word lines WL, the selection gate lines SGD and SGS, and the back gate line BG so as to form the string unit SU.

Peripheral circuits such as the sense amplifier 113 are formed on a semiconductor substrate. The memory cell array 111 is formed above the peripheral circuits. As shown in FIG. 4, a conductive layer (for example, a polysilicon layer) 21 functioning as the back gate line BG is formed above the semiconductor substrate. A plurality of conductive layers (for example, polysilicon layers) 23a to 23d functioning as the word lines WL are formed above the conductive layer 21. Conductive layers (for example, polysilicon layers) 27a and 27b functioning as the selection gate lines SGD and SGS are formed above the conductive layer 23d.

A memory hole 22 is formed so as to extend through the conductive layers 27a, 27b, and 23a to 23d. A block insulating film 25a, a charge accumulation layer (insulating film) 25b, and a gate insulating film 25c are sequentially formed on the inner surface of the memory hole 22. In addition, the memory hole 22 is filled with a conductive film 26. The conductive film 26 functions as the current path of the NAND string 114. The conductive film 26 is a region where a channel is formed when the memory cell transistors MT operate.

Conductive films 30a and 30b are formed on the conductive film 26. A source line layer 31 is formed on the conductive film 30a. A bit line layer 33 is formed is formed on a conductive film 32 on the conductive film 30b.

1.1.2.3 Threshold Voltage Distribution of Memory Cell Transistor

Figure 5:
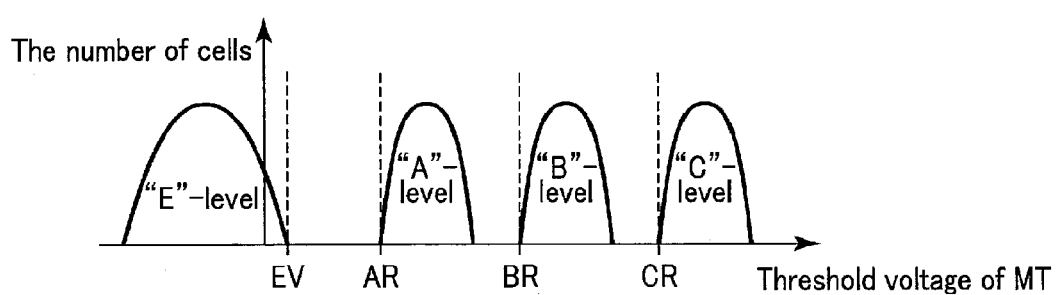
FIG. 5 is a graph showing the threshold voltage distribution of a memory cell according to the first embodiment.

FIG. 5 shows a threshold voltage distribution that the memory cell transistor MT according to this embodiment can take. As shown in FIG. 5, the memory cell transistor MT can hold, for example, 2-bit data in accordance with the threshold voltage. The 2-bit data correspond to, for example, "E"-level, "A"-level, "B"-level, and "C"-level in ascending order of threshold.

"E"-level is a threshold in a state in which data is erased. "E"-level has, for example, a negative value (or may have a positive value) which is lower than a verify voltage EV. "A"- to "C"-levels are thresholds in a state in which charges are injected into the charge accumulation layer. "A"-level is a threshold higher than a read level "AR" and lower than a read level "BR". "B"-level is a threshold higher than the read level "BR" and lower than a read level "CR". "C"-level is a threshold higher than the read level "CR".

In this way, each memory cell transistor MT can store 2-bit data (4-level data) by taking the four threshold levels.

1.1.3 Shift Table

A shift table stored by the controller 200 according to this embodiment will be described next. FIG. 6 is a conceptual view of the shift table.

In data reading, the NAND flash memory 100 according to this embodiment executes a retry read operation in response to an instruction from the controller 200 in addition to a normal read operation. In this operation, data reading is repeated while shifting the read voltage in accordance with a variation in the threshold voltage of the memory cell transistor MT caused by a disturbance or the like. Details will be described later in section 1.2 Read Operation.

As shown in FIG. 6, the shift table holds shift amounts in each retry reading for each of the read levels "AR", "BR", and "CR". The shift amount depends on the location of the conductive layer that forms the selected word line WL.

For example, in FIG. 6, when the word line WL0 or WL7 of the top layer is selected in first retry reading, the read levels "AR", "BR", and "CR" are shifted by Vshift_a0_1, Vshift_b0_1, and Vshift_c0_1, respectively (AR+Vshift_a0_1, BR+Vshift_b0_1, and CR+Vshift_c0_1). On the other hand, when the word line WL3 or WL4 of the bottom layer is selected in first retry reading, the read levels "AR", "BR", and "CR" are shifted by Vshift_a3_1, Vshift_b3_1, and Vshift_c3_1, respectively.

For second retry reading as well, the shift table holds shift amounts concerning the read levels "AR", "BR", and "CR". In the following explanation, the shift amounts will simply be referred to as Vshift without making a discrimination.

1.1.4 Sense Amplifier

The arrangement of the sense amplifier 113 will be described next. The sense amplifier 113 includes, for example, a plurality of sense circuits provided in association with the bit lines BL. Each sense circuit is formed on the semiconductor substrate and provided, for example, immediately under the memory cell array 111 described above. FIG. 7 is a circuit diagram of the sense circuit.

As shown in FIG. 7, a sense circuit 50 includes a sense amplifier unit 51 and a latch circuit 52. Note that when each memory cell transistor holds data of two or more bits, two or more latch circuits are provided.

The sense amplifier unit 51 senses/amplifies data read to the bit line BL and applies a voltage to the bit line BL in accordance with data held by the latch circuit 52. That is, the sense amplifier unit 51 is a module that directly controls the bit line BL. The latch circuit 52 temporarily holds data. In data writing, the latch circuit 52 holds write data received from the controller 200. In data reading, the latch circuit 52 holds data sensed/amplified by the sense amplifier unit 51 and transmits it to the controller 200.

The sense amplifier unit 51 includes n-channel MOS transistors 60 to 68, a p-channel MOS transistor 69, and a capacitor element 70.

A signal BLS is applied to the gate of the transistor 60. One end of the current path of the transistor 60 is connected to the corresponding bit line BL. One end of the current path of the transistor 61 is connected to the other end of the current path of the transistor 60. A signal BLC is applied to the gate of the transistor 61. The other end of the current path of the transistor 61 is connected to a node SCOM. The transistor 61 is provided to clamp the corresponding bit line BL to a potential according to the signal BLC.

The transistor 69 is provided to charge the bit line BL and the capacitor element 70, and has a gate connected to a node INV_S, a drain connected to a node SSRC, and a source given a power supply voltage VDD. The transistor 62 is provided to precharge the bit line BL, and has a gate given a signal BLX, a drain connected to the node SSRC, and a source connected to the node SCOM. The transistor 64 is provided to charge the capacitor element 70, and has a gate given a signal HLL, a drain connected to the node SSRC, and a source connected to a node SEN. The transistor 63 is provided to discharge the node SEN at the data sensing, and has a gate given a signal XXL, a drain connected to the node SEN, and a source connected to the node SCOM. The transistor 68 is provided to fix the bit line BL to a predetermined potential, and has a gate connected to the node INV_S, a drain connected to the bit line BL, and a source connected to a node SRCGND.

The capacitor element 70 is charged when the bit line BL is precharged. One electrode of the capacitor element 70 is connected to the node SEN, and a signal CLK is given to the other electrode.

The transistor 65 has a gate given a signal BLQ, a source connected to the node SEN, and a drain connected to a node LBUS. The node LBUS is a signal path to connect the sense amplifier unit 51 and the latch circuit 52. The transistor 66 is provided to store read data into the latch circuit 52, and has a gate given a signal STB and a drain connected to the node LBUS.

The transistor 67 is provided to sense whether read data is "0" or "1", and has a gate connected to the node SEN, a drain connected to the source of the transistor 66, and a source grounded.

The node INV_S is a node in the latch circuit 52, and can have a level according to held data. For example, at the time of data read, when the selected memory cell changes to an ON state, and the potential of the node SEN sufficiently lowers, the node INV_S changes to "H" level. On the other hand, when the selected memory cell is in an OFF state, and the node SEN holds a predetermined potential, the node INV_S changes to "L" level.

In the above-described arrangement, various kinds of control signals are given by, for example, the sequencer 121. The operation of the sense circuit 50 will be described in chapter 1.2 below.

1.2 Data Read Operation

The data read method of the memory system 1 according to this embodiment will be described next.

1.2.1 Voltage Relationship in Read Operation

Figure 8:
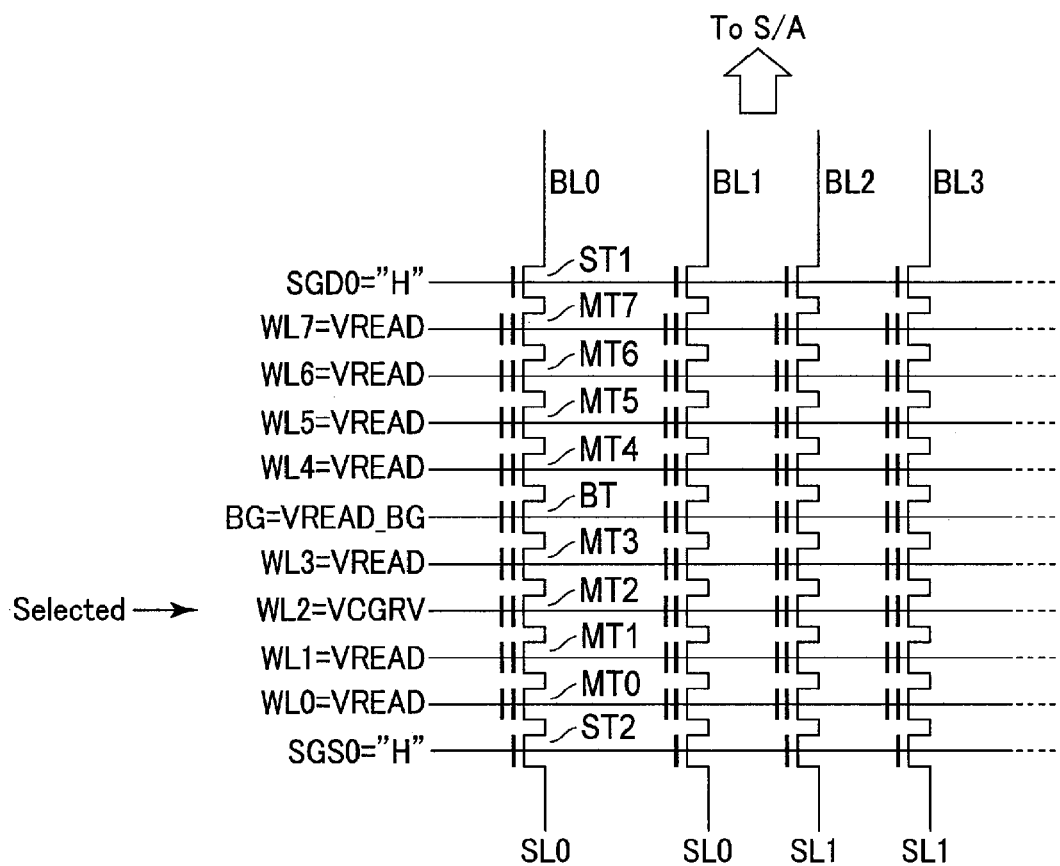

Voltages applied to the interconnects of the memory cell array 111 in data reading will be described with reference to FIG. 8. FIG. 8 shows the voltage relationship of the interconnects in data reading operation in the selected string unit SU0 of the selected block ELK.

As shown in FIG. 8, the row decoder 112 applies "H" level to the selection gate lines SGD0 and SGS0 to turn on the selection transistors ST1 and ST2. The row decoder 112 also applies a read voltage VCGRV to the selected word line WL2. The voltage VCGRV has a value according to data to be read. That is, in a normal read operation, the read level "AR", "BR", or "CR" is applied to the selected word line WL as the voltage VCGRV. In retry read, a value obtained by adding a shift amount read from the shift table to the value is applied to the selected word line WL as the voltage VCGRV.

On the other hand, the row decoder 112 applies a voltage VREAD to the unselected word lines WL0, WL1, and WL3 to WL7. The voltage VREAD is a voltage that turns on the memory cell transistor MT independently of held data.

Hence, when the memory cell transistors MT connected to the selected word line WL are turned on, a current flows from the bit line BL to the source line SL in the corresponding NAND string 114. On the other hand, when the memory cell transistors MT are turned off, no current flows from the bit line BL to the source line SL. When the sense amplifier 113 senses/amplifies the current, data can be discriminated.

1.2.2 Procedure of Reading Operation

FIG. 9 is a flowchart showing a series of operations from a normal reading operation to retry reading. Note that in FIG. 9, the operation of the NAND flash memory 100 is executed, for example, under control of the sequencer 121, and the operation of the controller 200 is executed, for example, under control of the CPU 230.

First, in response to an instruction from a host device (not shown), the CPU 230 of the controller 200 issues a read command and transmits it to the NAND flash memory 100 (step S10). At this time, the CPU 230 transmits a block address and a page address to the NAND flash memory 100 successively.

The read command is stored in, for example, the register 123 of the NAND flash memory 100. In response to this, the sequencer 121 executes normal reading (step S11). That is, the sequencer controls the charge pump 122, the driver 124, the row decoder 112, and the sense amplifier 113, thereby applying the voltages shown in FIG. 8 to the memory cell array 111. As described above, in normal reading, VCGRV="AR", "BR", or "CR". "AR", "BR", and "CR" are ideal threshold voltages immediately after data writing. Normal reading is a reading operation performed using these voltages. Contrary to normal reading, a reading operation performed after normal reading in consideration of a threshold voltage variation caused by the influence of a disturbance after writing is retry reading to be described later.

The data reading in step S11 is held by, for example, the buffer memory 240 of the controller 200 via the NAND interface. The ECC circuit 260 checks the presence/absence of an error in the read data, and if an error exists, corrects it (step S12). If no error exits, or the number of errors (the number of defective bits) is not more than a predetermined number, and error correction is possible (Pass in step S12), the data reading operation from the page is completed.

On the other hand, if the number of errors (the number of defective bits) exceeds the predetermined number, the ECC circuit 260 cannot correct the errors (Fail in step S12). Hence, the CPU 230 of the controller 200 shifts the read level and performs reading again to execute retry reading. For this purpose, the CPU 230 reads a shift table T1 concerning the first retry reading from the internal memory 220 (step S13). The CPU 230 issues a retry read command together with the voltage shift amount Vshift corresponding to the layer of the word line as the read target, in other words, corresponding to the page address, and transmits them to the NAND flash memory 100 (step S14).

In response to the received command, the sequencer 121 of the NAND flash memory 100 executes the first retry reading (step S15). At this time, the row decoder 112 applies the voltage VCGRV according to the received voltage shift amount Vshift to the selected word line WL. For example, if the selected word line WL is the word line WL0 or WL7 of the top layer, the row decoder 112 applies VCGRV="AR"+Vshift_a0_1 to read "A"-level, applies VCGRV="BR"+Vshift_b0_1 to read "B"-level, and applies VCGRV="CR"+Vshift_c0_1 to read "C"-level. If the selected word line WL is the word line WL3 or WL4 of the bottom layer, the row decoder 112 applies VCGRV="AR"+Vshift_a3_1 to read "A"-level, applies VCGRV="BR"+Vshift_b3_1 to read "B"-level, and applies VCGRV="CR"+Vshift_c3_1 to read "C"-level.

The data read in step S15 is stored in, for example, the buffer memory 240 of the controller 200 via the NAND interface. The ECC circuit 260 checks the presence/absence of an error in the read data, and if an error exists, corrects it (step S16). If no error exists, or the number of errors (the number of defective bits) is not more than a predetermined number, and error correction is possible (Pass in step S16), the data reading operation from the page is completed.

On the other hand, if the number of errors (the number of defective bits) exceeds the predetermined number, the CPU 230 executes second retry reading. That is, the CPU 230 reads a shift table T2 concerning the second retry reading from the internal memory 220 (step S17). The CPU 230 issues a retry read command together with the voltage shift amount Vshift corresponding to the layer of the word line as the read target, in other words, corresponding to the page address, and transmits them to the NAND flash memory 100 (step S18).

In response to the received command, the sequencer 121 of the NAND flash memory 100 executes the second retry reading (step S19). At this time, the row decoder 112 applies the voltage VCGRV according to the received voltage shift amount Vshift to the selected word line WL, as in the first retry reading. For example, if the selected word line WL is the word line WL0 or WL7 of the top layer, the row decoder 112 applies VCGRV="AR"+Vshift_a0_2 to read "A"-level, applies VCGRV="BR"+Vshift_b0_2 to read "B"-level, and applies VCGRV="CR"+Vshift_c0_2 to read "C"-level. This also applies to the other word lines.

After that, the controller 200 repeats retry reading n (n is a natural number, n≥2) times at maximum until the number of errors becomes zero or decreases to a predetermined number or less. If the number of errors exceeds the predetermined number even in the nth retry reading (Fail in step S24), the reading operation ends to failure.

1.2.3 Change in Word Line Voltage in Reading Operation

FIG. 10 is a timing chart showing a change in the voltage VCGRV applied to the selected word line WL from normal reading to the nth retry reading.

As shown in FIG. 10, the voltage VCGRV is stepped up every time retry reading is repeated (Vshift is a positive value), as compared to the time of normal reading. VCGRV is maximized at the time of (n−1)th retry reading. Vshift is set to a negative value in the last nth retry reading and made smaller than the value in the normal reading.

Vshift is smaller for a word line located on the upper side and larger for a word line located on the lower side. That is, place focus on, for example, first retry reading concerning "A"-level. The voltage shift amounts hold a relationship Vshift_a0_1<Vshift_a2_1<Vshift_a3_1. This also applies to other voltage shift amounts.

1.2.4 Operation of Sense Amplifier in Reading Operation

The operation of the sense circuit 50 in the reading operation will be described next with reference to FIG. 11.

As shown in FIG. 11, the row decoder 112 applies predetermined potentials to the selected word line, the unselected word lines, and the selection gate lines SGD and SGS (time t0). That is, the row decoder 112 controls the voltage VCGRV based on whether the operation is normal reading or retry reading, as described above. In retry reading, the row decoder 112 further controls the voltage VCGRV based on the ordinal number of the retry reading and the layer in which the selected word line is located. In retry reading, the lower the layer position is, the higher the set voltage VCGRV is.

The row decoder 112 also applies the voltage VREAD to the unselected word lines. The voltage VREAD is a voltage that turns on the unselected memory cells independently of held data.

In addition, the row decoder 112 applies a voltage to the selection gate lines SGD and SGS. That is, the row decoder 112 applies a voltage VSG to the selection gate lines SGD and SGS corresponding to the selected string unit SU, thereby turning on the selection transistors ST1 and ST2. On the other hand, the row decoder 112 applies, for example, a negative voltage VBB to the selection gate lines SGD and SGS corresponding to each unselected string unit SU, thereby turning off the selection transistors ST1 and ST2.

Next, the sequencer 121 sets the signal BLS to "H" level to connect the sense circuit 50 to the corresponding bit line BL. The node INV_S is reset to "L" level.

The sense circuit 50 precharges the bit line BL. That is, the sequencer 121 sets the signals BLX and BLC to "H" level (time t1). The bit line BL is thus precharged to the voltage VDD via the current paths of the transistors 60 to 62 and 69. Note that a voltage VH in FIG. 11 is a voltage that allows a transistor to transfer the voltage VDD. A voltage VBLC is a voltage that determines the bit line voltage. The bit line voltage is a voltage Vbl clamped by the voltage VBLC.

Next, the sense circuit 50 charges the node SEN. That is, the sequencer 121 sets the signal HLL to "H" level (time t2). The transistor 64 is thus turned on, and the node SEN is charged to the voltage VDD. Charge of the node SEN is performed up to time t3. When the potential of the node SEN reaches VDD, the transistor 67 is turned on.

Then, the sense circuit 50 senses the bit line BL. That is, the sequencer 121 sets the signal XXL to "H" level (time t4). The transistor 63 is thus turned on, and the node SEN is electrically connected to the bit line BL. If the selected memory cell is ON, a current flows from the node SEN to the source line SL, and the potential of the node SEN lowers.

On the other hand, if the selected memory cell is OFF, no current flows from the node SEN to the source line SL, and the potential of the node SEN almost maintains VDD.

Finally, the sense circuit 50 strobes data. That is, the sequencer 121 sets the signal STB to "H" level (time t6). The transistor 66 is thus turned on. If the transistor 67 is ON (that is, SEN="H"), the node LBUS is discharged almost to VSS, and "L" level is stored in the node INV_S. If the transistor 67 is OFF (that is, SEN="L"), the potential of the node LBUS maintains VDD, and "H" level is stored in the node INV_S.

The state of reading "A", "B", or "C"-level data has been described with reference to FIG. 11. The above-described operation is executed in reading each level. The voltage VCGRV at that time is also set based on the shift table.

1.3 Effects of this Embodiment

According to the arrangement of this embodiment, operation reliability of the NAND flash memory can be improved. This effect will be described below.

In a NAND flash memory with memory cell transistors two-dimensionally arranged on a semiconductor substrate, if defective bits in an amount uncorrectable by ECC are detected in normal reading, a sequence of shifting the read level and performing reading again may be executed (retry reading or called dynamic read or shift read). Retry reading is performed to improve the success probability of the reading operation in a case in which the threshold voltage distribution of the read target cells shift to the positive side due to a read disturbance or program disturbance, thereby the number of defective bits increases.

However, in the 3D stacked NAND flash memory described with reference to FIGS. 3 and 4, the success probability of the reading operation cannot be expected to be improved by applying even the same method in the NAND flash memory with the two-dimensionally arranged memory cells. This is because the received disturbance amount changes between the layers of word lines.

FIG. 12 is a schematic view of the sectional structure of the NAND string 114. FIG. 12 shows an example in which the number of stacked layers of the word lines WL is (m+1), and the number of word lines is (2m+1). This structure is manufactured by the following method. That is, the back gate line BG is formed first. Then, (m+1) interlayer dielectric films and (m+1) word line layers are alternately formed. Next, a memory hole MH is formed so as to extend through the (m+1) interlayer dielectric films and the (m+1) word line layers. After that, a polysilicon layer is buried in the memory hole.

In the 3D-stacked NAND flash memory, the degree of integration of memory cells can be improved by increasing the number of layers of word lines. However, as the number of layers increases, the memory hole MH tapers. A diameter $d_{MH}$ of the memory hole MH is small in a lower layer and large in an upper layer. As a result, a disturbance received by a memory cell changes between the layers. More specifically, the disturbance is large in a lower layer and small in an upper layer. Because of the difference in the disturbance, the threshold voltage difference also changes between the layers. This will be described with reference to FIG. 13.

Figure 13:
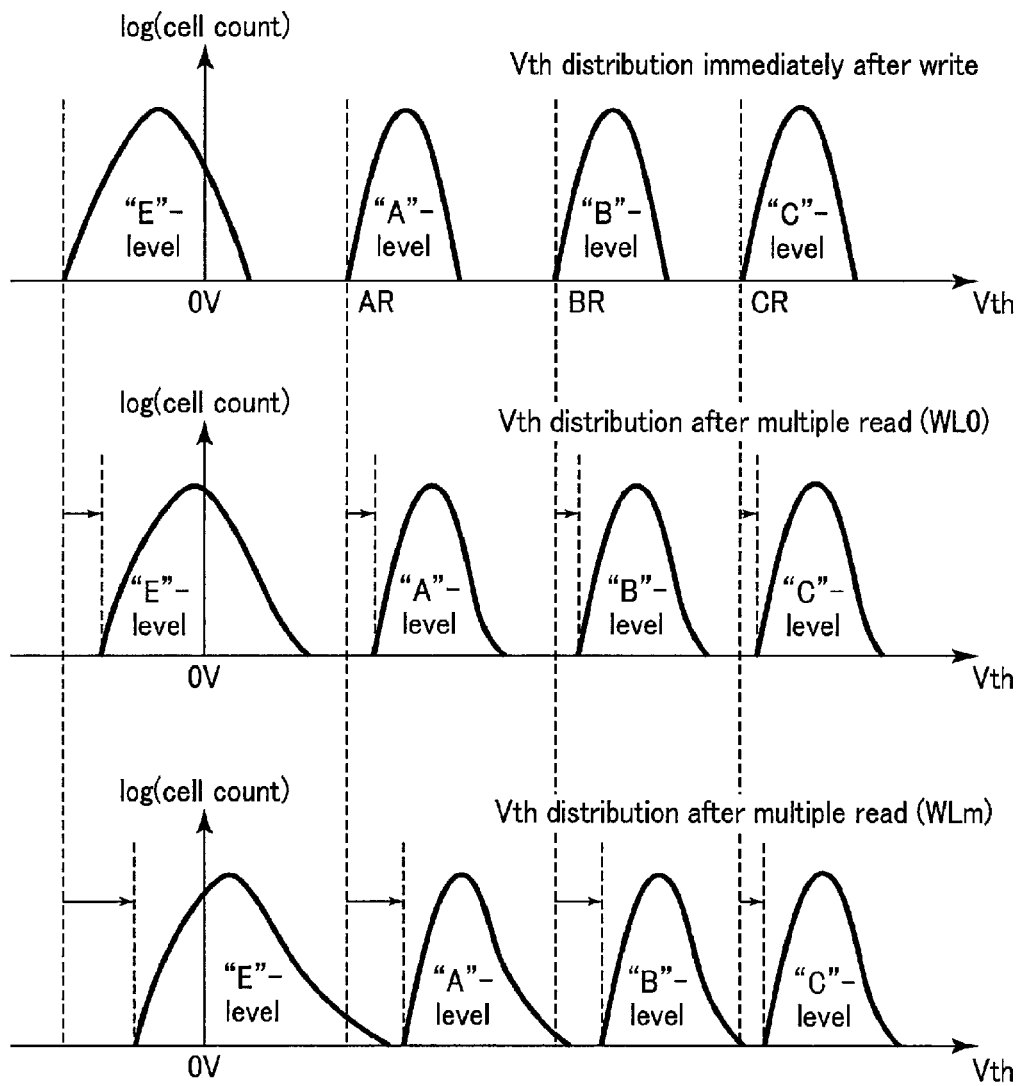
FIG. 13 is a graph showing changes in the threshold voltage distributions of memory cells.

FIG. 13 is a graph showing the threshold voltage distributions of memory cells. FIG. 13 shows the threshed distribution immediately after writing, the threshed distribution after multiple reading sequences for the word line WL0 of the top layer, and the threshed distribution after reading multiple times for the word line WLm of the bottom layer.

As shown in FIG. 13, the threshold voltages of memory cells connected to the word lines WL0 and WLm shift to the positive side because of the disturbance due to reading multiple times. However, the shift amount differs between the word lines WL0 and WLm. The shift amount is large in the word line WL located in a lower layer. Each threshed distribution is not only shifted in parallel but also increases the distribution width every time a disturbance is received. At this time, the upper limit side of the threshed distribution readily extends. The degree of increase in the distribution width particularly tends to be maximum in "E"-level and minimum in "C"-level (E>A>B>C). As a result, the threshold voltages of memory cells that hold "E"-level, "A"-level, and "B"-level partially exceed "AR", "BR", and "CR" levels, respectively, resulting in a read error. Hence, in retry reading that simply uniformly shifts the voltage VCGRV for all word lines WL, improvement of the success probability of the reading operation is assumed to be insufficient.

In this respect, according to this embodiment, the voltage shift amount in retry reading is set in accordance with the layer in which the word line WL is located. That is, the controller 200 holds a shift table that defines the VCGRV shift amount of each word line for each of "A"-level reading, "E"-level reading, and "C"-level reading. VCGRV is set based on this table. The shift amount is set based on, for example, an experimental result in a pre-shipment test of a product such that the success probability of retry reading is maximized. For example, VCGRV for the word line WL of a lower layer that readily receives a read disturbance is set to be higher than VCGRV for the word line WL of an upper layer because the threshed distribution readily shifts to the positive side. Every time retry reading is repeated, the controller 200 reads a shift table according to the repetition count and sets optimum VCGRV.

This state is shown in FIG. 14. FIG. 14 is a graph showing the relationship between VCGRV and the memory hole diameter. As shown in FIG. 14, the smaller the memory hole diameter is, in other words, the lower the layer position is, the larger the set value of VCGRV is. Note that FIG. 14 shows an example in which the influence of the disturbance is maximum for "A"-level and minimum for "C"-level. Hence, the voltage shift amount in retry reading is set to the maximum value in "A"-level reading, the next largest value in "B"-level reading, and the minimum value in "C"-level reading.

Accordingly, it is possible to set VCGRV to an optimum value for each memory cell and improve the success probability of the reading operation.

Note that in this embodiment, the voltage shift amount in the last retry reading is set to a negative value, as described with reference to FIG. 10. This aims at coping with a memory cell whose threshold voltage lowers due to removal of captured electrons by a discharge field.

Note that the shift tables may be updated by the CPU 230 of the controller 200 even after shipment of the product. That is, the CPU 230 holds the read count and standing time of each memory cell in, for example, the internal memory 220. The shift amounts in the shift tables can appropriately be updated based on these pieces of information. This enables a more reliable reading operation.

2. Second Embodiment

A semiconductor memory device according to the second embodiment will be described next. In this embodiment, a plurality of word lines WL are managed as one zone and the shift amount of VCGRV is controlled on a zone basis in the first embodiment. Only points different from the first embodiment will be described below.

2.1 Concept of Zone

Figure 15:
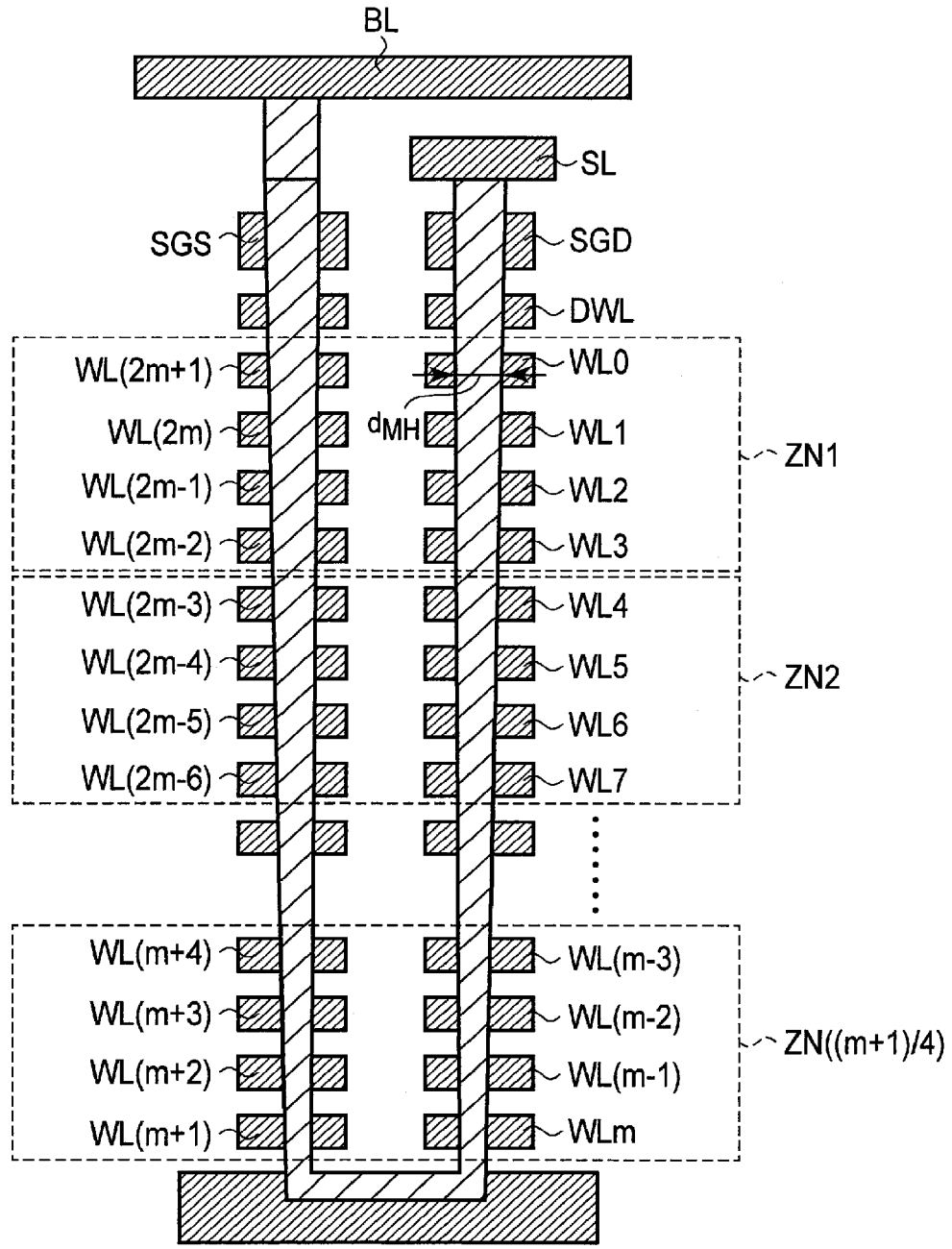
FIG. 15 is a sectional view of a NAND string according to the second embodiment.

The concept of zone management according to this embodiment will be described with reference to FIG. 15. FIG. 15 is a sectional view of a NAND string 114 in a case in which the number of word line layers is (m+1), as in FIG. 12.

As shown in FIG. 15, a controller 200 controls the word lines WL in every four layers. That is, the controller 200 handles word lines WL0 to WL3 and WL($2m-2$) to WL($2m+1$) formed in the top to fourth layer as a zone ZN1. The controller 200 also handles the word lines WL4 to WL7 and WL($2m-6$) to WL($2m-3$) formed in the fifth to eighth layers as a zone ZN2. This also applies to the following, and the controller 200 handles the word lines WL(m−3) to WLm and WL(m+1) to WL(m+4) formed in the four layers located in the lowermost layer as a zone ZN((m+1)/4).

The controller 200 sets the voltage shift amount in retry reading on a zone basis.

2.2 Shift Table

FIG. 16 is a conceptual view of a shift table according to this embodiment. As shown in FIG. 16, the shift table holds voltage shift amounts to be used from the first retry reading to the nth retry reading for each zone ZN.

For example, when one of the four word lines WL belonging to the zone ZN1 is selected, the voltage shift amounts in first retry reading are Vshift_a0_1, Vshift_b0_1, and Vshift_c0_1 for "A"-level reading, "B"-level reading, and "C"-level reading, respectively. The voltage shift amounts in second retry reading are Vshift_a0_2, Vshift_b0_2, and Vshift_c0_2 for "A"-level reading, "B"-level reading, and "C"-level reading, respectively.

When one of the four word lines WL belonging to the zone ZN2 is selected, the voltage shift amounts in first retry reading are Vshift_a1_1, Vshift_b1_1, and Vshift_c1_1 for "A"-level reading, "B"-level reading, and "C"-level reading, respectively. The voltage shift amounts in second retry reading are Vshift_a1_2, Vshift_b1_2, and Vshift_c1_2 for "A"-level reading, "B"-level reading, and "C"-level reading, respectively.

This also applies to the following. The deeper the zone ZN is, in other words, the deeper the word line layer is, the larger the voltage shift amount is. This state is shown in FIG. 17. FIG. 17 is a graph showing the relationship between the voltage VCGRV and the memory hole diameter in certain retry reading, and corresponds to FIG. 14 described in the first embodiment.

As shown in FIG. 17, the smaller the memory hole diameter is, the larger the set value of VCGRV is as in the first embodiment. Unlike the first embodiment, VCGRV holds a predetermined value within a predetermined range of memory hole diameter.

2.3 Reading Operation

Figure 18:
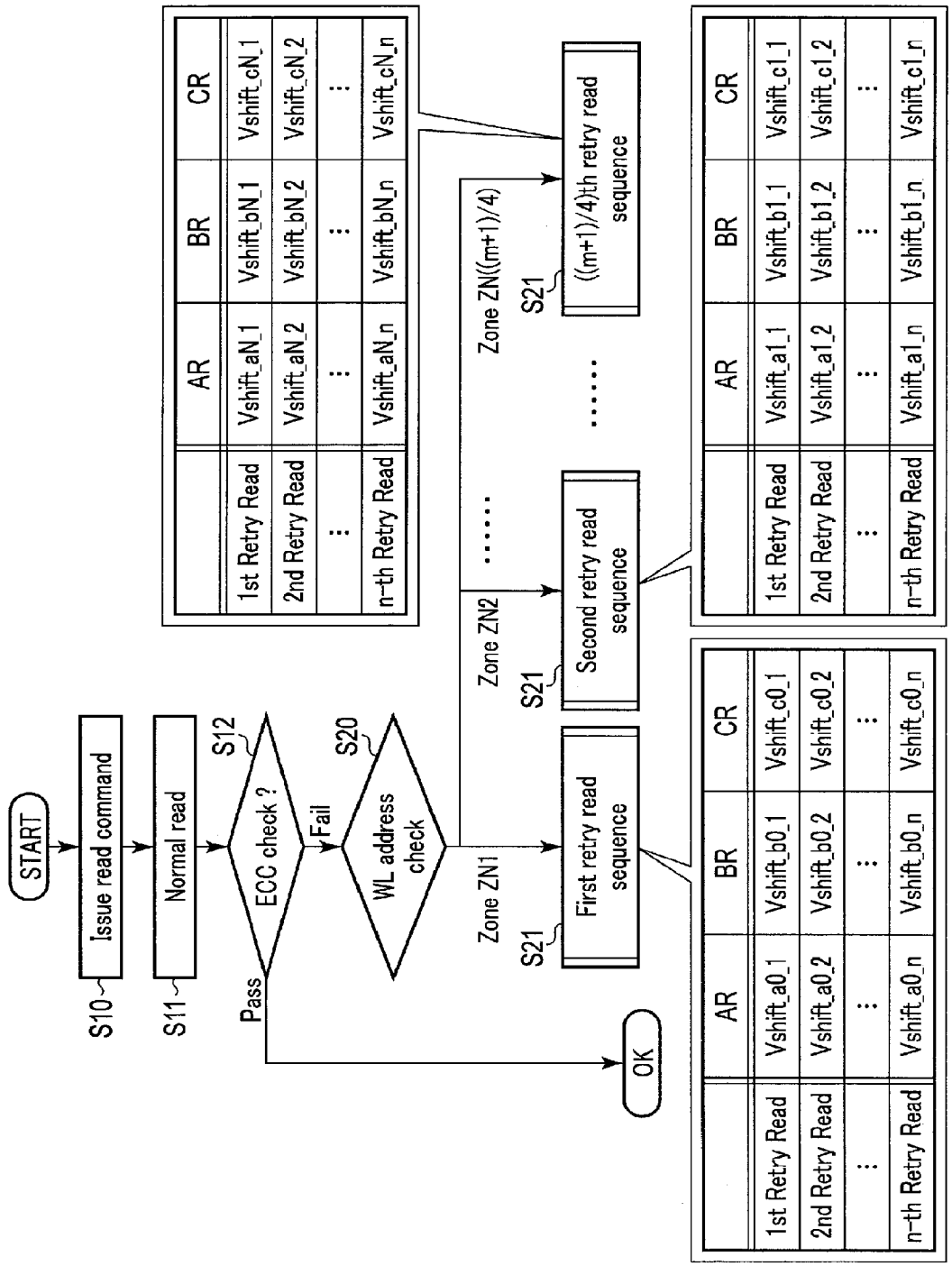
FIG. 18 and FIG. 19 are flowcharts showing a data reading method according to the second embodiment and the third embodiment.

FIG. 18 is a flowchart showing a series of operations from a normal reading operation to retry reading according to this embodiment, and corresponds to FIG. 9 described in the first embodiment.

As shown in FIG. 18, normal reading is executed first by steps S10 and S11, as in FIG. 9. In the normal reading, if no error exits in read data, or the number of errors (the number of defective bits) is not more than a predetermined number (Pass in step S12), the data reading operation from the page is completed.

On the other hand, if the number of errors (the number of defective bits) exceeds the predetermined number, the controller 200 executes retry reading. When executing the retry reading, a CPU 230 of the controller 200 checks the WL address (or page address) of the selected word line WL (step S20). In other words, the CPU 230 confirms which zone ZN the read target page corresponds to.

If the selected word line WL belongs to the zone ZN1 (that is, one of the word lines WL0 to WL3 and WL($2m-1$) to WL($2m+2$) is selected), the CPU 230 reads a shift table corresponding to the zone ZN1 from an internal memory 220, and executes the retry reading using it (step S21).

If the selected word line WL belongs to the zone ZN2 (that is, one of the word lines WL4 to WL7 and WL($2m-5$) to WL($2m-2$) is selected), the CPU 230 reads a shift table corresponding to the zone ZN2 from the internal memory 220, and executes the retry reading using it (step S21).

This also applies to the following. If the selected word line WL belongs to the zone ZN((m+1)/4) (that is, one of the word lines WL(m−3) to WL(m+4) is selected), the CPU 230 reads a shift table corresponding to the zone ZN((m+1)/4) from the internal memory 220, and executes the retry reading using it (step S21).

The process of step S21 is the same as steps S13 to S24 in FIG. 9 described in the first embodiment. Unlike the first embodiment, the same voltage shift amount is applied to the word lines WL belong to the same zone ZN.

2.4 Effects of this Embodiment

According to the arrangement of this embodiment, operation reliability can be improved by simple control as compared to the first embodiment.

That is, in the first embodiment, VCGRV is set for each word line layer. In this embodiment, however, the word lines WL are managed in a group (zone) to some extent. The VCGRV shift amount in retry reading is set on a zone basis. Hence, cumbersomeness in setting the VCGRV shift amount can be eliminated.

On the other hand, memory cell transistors formed in adjacent layers have almost the same shape, and the difference in the memory hole diameter is small. Hence, these memory cells are expected to receive the same disturbance characteristic or data retention characteristic. Hence, even when the VCGRV shift amount is set on a zone basis, the success probability of the reading operation can sufficiently be improved.

3. Third Embodiment

A semiconductor memory device according to the third embodiment will be described next. In this embodiment, the semiconductor memory device holds a shift table in the first and second embodiments. Only points different from the first and second embodiments will be described below.

3.1 Reading Operation

Figure 19:
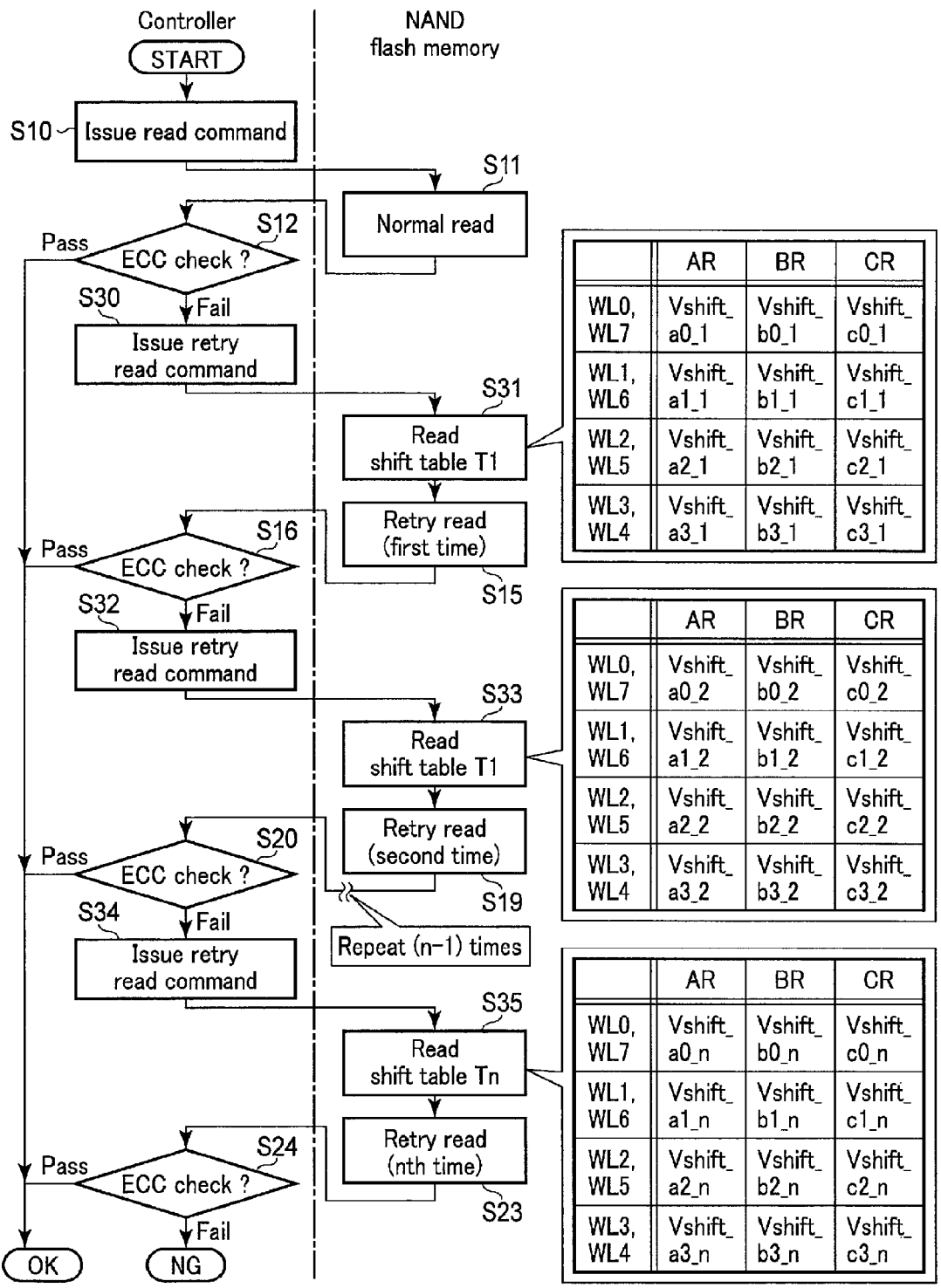

A reading operation according to this embodiment will be described with reference to FIG. 19. FIG. 19 is a flowchart showing a series of operations from a normal reading operation to retry reading according to this embodiment. An example in which the shift table described in the first embodiment with reference to FIG. 6 is stored in, for example, a ROM fuse of a NAND flash memory 100 will be described with reference to FIG. 19.

The ROM fuse is an area to hold information unique to the NAND flash memory 100. One of blocks ELK is used as a ROM fuse block. For example, information representing a disabled bad block, column redundancy information used to replace a defective column (bit line), trimming information, and the like are stored in the ROM fuse area. In this embodiment, the above-described shift table is also written to the ROM fuse area.

When the NAND flash memory 100 is powered on, a sequencer 121 spontaneously reads the information in the ROM fuse without receiving an instruction from a controller 200. At this time, the shift table is also read to a register 123. In a subsequent operation, the sequencer 121 refers to the shift table in the register 123. FIG. 19 shows an operation after the shift table is read to the register 123.

As shown in FIG. 19, normal reading is executed first by steps S10 and S11, as in FIG. 9. In the normal reading, if no error exits in read data, or the number of errors (the number of defective bits) is not more than a predetermined number (Pass in step S12), the data reading operation from the page is completed.

On the other hand, if the number of errors (the number of defective bits) exceeds the predetermined number, the controller 200 executes retry reading. That is, a CPU 230 of the controller 200 issues a retry read command and transmits it to the NAND flash memory 100 together with a word line address (page address) (step S30). At this time, the CPU 230 also transmits information representing the ordinal number (step S30 corresponds to a first time) of the retry reading and an issued retry read command to the NAND flash memory 100.

The command, address, and information are held in, for example, the register 123. Based on the received command, address, and information, the sequencer 121 reads a shift table T1 concerning the first retry reading from the register 123 (step S31). This is almost the same as in step S13 described with reference to FIG. 9 of the first embodiment.

The sequencer 121 executes the first retry reading (step S15). That is, a row decoder 112 sets a voltage VCGRV based on information in the shift table T1, and applies it to a selected word line WL.

After that, the controller 200 executes the process of step S16, and executes retry reading n times at maximum as needed.

3.2 Effects of this Embodiment

Even when the shift table is stored in the NAND flash memory 100, as in this embodiment, the same effects as in the first embodiment can be obtained. Additionally, according to this embodiment, the load on the controller 200 can be reduced.

Note that a case in which the NAND flash memory 100 holds the shift table explained in the first embodiment has been described with reference to FIG. 19. However, the shift table explained in the second embodiment may be held.

4. Fourth Embodiment

A semiconductor memory device according to the fourth embodiment will be described next. In this embodiment, the arrangement of a memory cell array 111 is modified in the first to third embodiments. Only points different from the first to third embodiments will be described below.

4.1 Arrangement of Memory Cell Array

Figure 20:
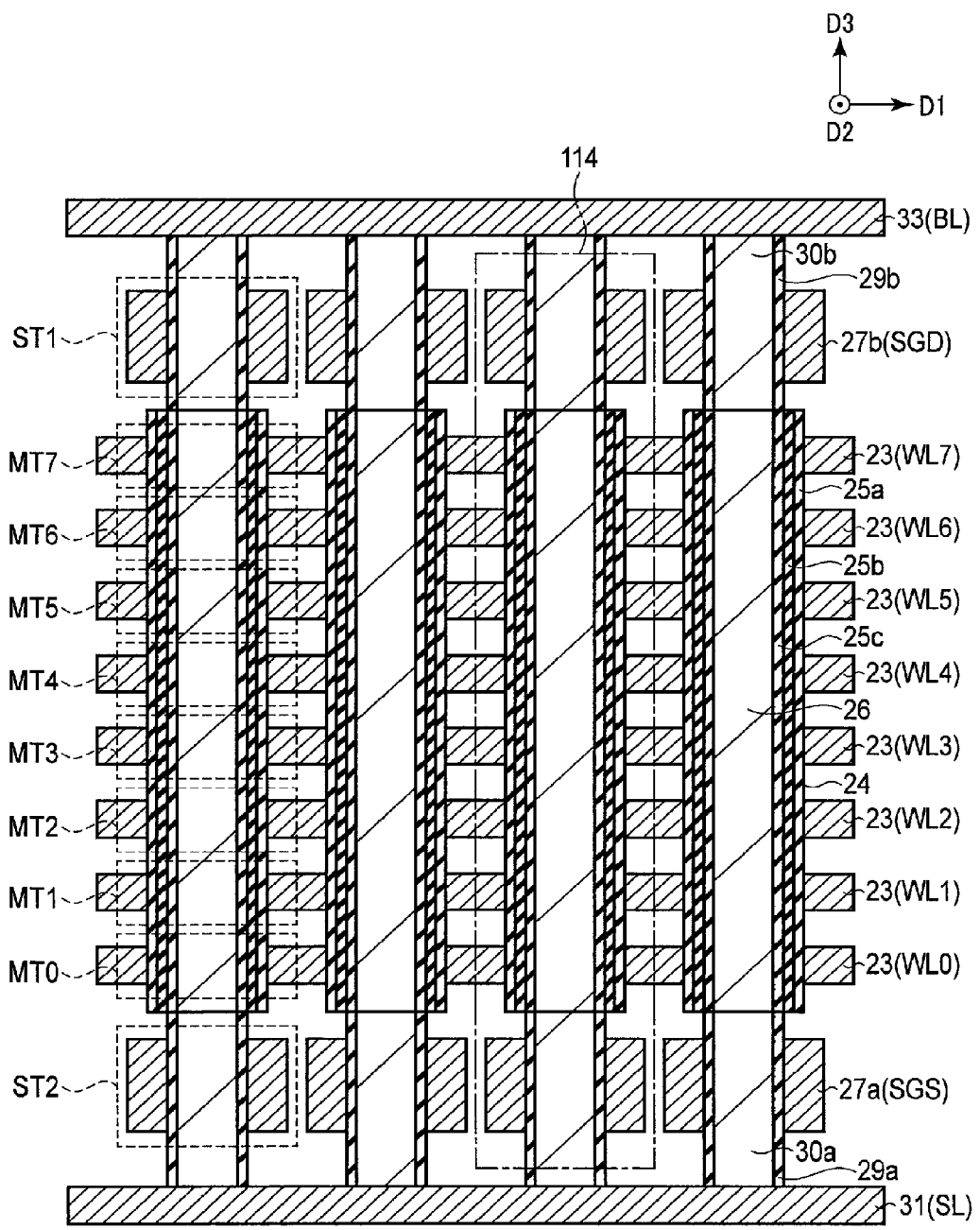
FIG. 20 is a sectional view of a memory cell array according to the fourth embodiment.

FIG. 20 is a sectional view of the memory cell array 111 according to this embodiment taken along a bit line direction.

As shown in FIG. 20, a semiconductor layer 26 may have the shape of one column in place of a U-shape as shown in FIGS. 4 and 12. In this case, as shown in FIG. 20, a source line layer 31 is formed above a semiconductor substrate. A plurality of columnar semiconductor layers 30 and 26 are formed on the source line layer 31. A selection transistor ST2, memory cell transistors MT0 to MT7, and a selection transistor ST1 are formed around the semiconductor layers 30 and 26 sequentially from the lower side, and a bit line layer 33 is further formed. In this arrangement, a back gate transistor BT is unnecessary.

4.2 Shift Table

FIG. 21 is a conceptual view of a shift table according to this embodiment. In this example, a voltage shift amount is defined for each of word lines WL0 to WL7, as shown in FIG. 21.

In this example, the voltage shift amount for the word line WL0 located in the bottom layer is maximum, and the voltage shift amount for the word line WL7 located in the top layer is minimum.

4.3 Effects of this Embodiment

As described above, the first to third embodiments are applicable to a NAND flash memory having the structure shown in FIG. 20.

A set of a plurality of word lines WL may be managed as a zone, as in the second embodiment, as a matter of course.

5. Fifth Embodiment

A semiconductor memory device according to the fifth embodiment will be described next. In this embodiment, the arrangement of a memory cell array 111 is modified in the first to fourth embodiments. Only points different from the first to fourth embodiments will be described below.

5.1 Arrangement of Memory Cell Array

FIG. 22 is a circuit diagram of the memory cell array 111 according to this embodiment. FIG. 22 shows the arrangement of one block BLK. As shown in FIG. 22, the block BLK includes a plurality of memory units MU (MU1 and MU2). FIG. 22 illustrates only two memory units MU. However, the number of memory units MU is not limited, and may be three or more.

Each memory unit MU includes, for example, four string groups GR (GR1 to GR4). Note that to make a discrimination between the memory units MU1 and MU2, the string groups GR in the memory unit MU1 will be referred to as GR1-1 to GR4-1, and the string groups GR in the memory unit MU2 will be referred to as GR1-2 to GR4-2.

Each string group GR includes, for example, three NAND strings SR (SR1 to SR3). The number of NAND strings SR is not limited to three, and may be four or more, as a matter of course. Each NAND string SR includes selection transistors ST1 and ST2 and four memory cell transistors MT (MT1 to MT4). The number of memory cell transistors MT is not limited to four, and may be five or more or three or less.

In the string group GR, the three NAND strings SR1 to SR3 are sequentially stacked on the semiconductor substrate. The NAND string SR1 is formed in the bottom layer, and the NAND string SR3 is formed in the top layer. That is, in FIG. 4 described in the first embodiment, the memory cell transistors MT in the NAND string are stacked in the vertical direction with respect to the semiconductor substrate surface. In this embodiment, however, the memory cell transistors MT in the NAND string are arranged in a direction parallel to the semiconductor substrate surface, and the NAND strings are stacked in the vertical direction. The selection transistors ST1 and ST2 included in the same string group GR are connected to the same selection gate lines GSL1 and GSL2, respectively. The control gates of the memory cell transistors MT located on the same column are connected to the same word line WL. In addition, the drains of the three selection transistors ST1 in a certain string group GR are connected to the bit lines BL that are different from each other, and the sources of the selection transistors ST2 are connected to the same source line SL.

The selection transistors ST1 and ST2 are arranged so as to reverse the positional relationship between the odd-numbered string groups GR1 and GR3 and the even-numbered string groups GR2 and GR4. That is, in the example of FIG. 22, the selection transistors ST1 of the string groups GR1 and GR3 are arranged at the left-end of the NAND strings SR, and the selection transistors ST2 are arranged at the right-end of the NAND strings SR. On the other hand, the selection transistors ST1 of the string groups GR2 and GR4 are arranged at the right-end of the NAND strings SR, and the selection transistors ST2 are arranged at the left-end of the NAND strings SR.

The gates of the selection transistors ST1 of the string groups GR1 and GR3 are connected to the same selection gate line GSL1, and the gates of the selection transistors ST2 are connected to the same selection gate line GSL2. On the other hand, the gates of the selection transistors ST1 of the string groups GR2 and GR4 are connected to the same selection gate line GSL2, and the gates of the selection transistors ST2 are connected to the same selection gate line GSL1.

The four string groups GR1 to GR4 included in a certain memory unit MU are connected to the same bit lines BL, and different memory units MU are connected to the bit lines BL that are different from each other. More specifically, in the memory unit MU1, the drains of the selection transistors ST1 of the NAND strings SR1 to SR3 in the string groups GR1 to GR4 are connected to bit lines BL1 to BL3 via column select gates CSG (CSG1 to CSG4). Each column select gate CSG has the same arrangement as, for example, the memory cell transistor MT or the selection transistors ST1 and ST2, and selects one string group GR to be connected to the bit line BL in each memory unit MU. Hence, the gates of the column select gates CSG1 to CSG4 associated with the string groups GR are controlled by different control signal lines SSL1 to SSL4, respectively.

A plurality of memory units MU each having the above-described arrangement are arrayed in the vertical direction on the sheet surface of FIG. 22. The plurality of memory units MU share the word lines WL and the selection gate lines GSL1 and GSL2 with the memory unit MU1. On the other hand, the bit lines BL are independent. For example, three bit lines BL4 to BL6 different from those of the memory unit MU1 are associated with the memory unit MU2. The number of bit lines BL associated with each memory unit MU corresponds to the total number of NAND strings SR included in one string group GR. Hence, if four NAND strings exist, four bit lines BL are provided. This also applies to other numbers. The control signals SSL1 to SSL4 may be common to the memory units MU or may be controlled independently.

In the above arrangement, the set of a plurality of memory cell transistors MT connected to the same word line WL in one string group GR selected from each memory unit MU is a "page".

Figure 25:
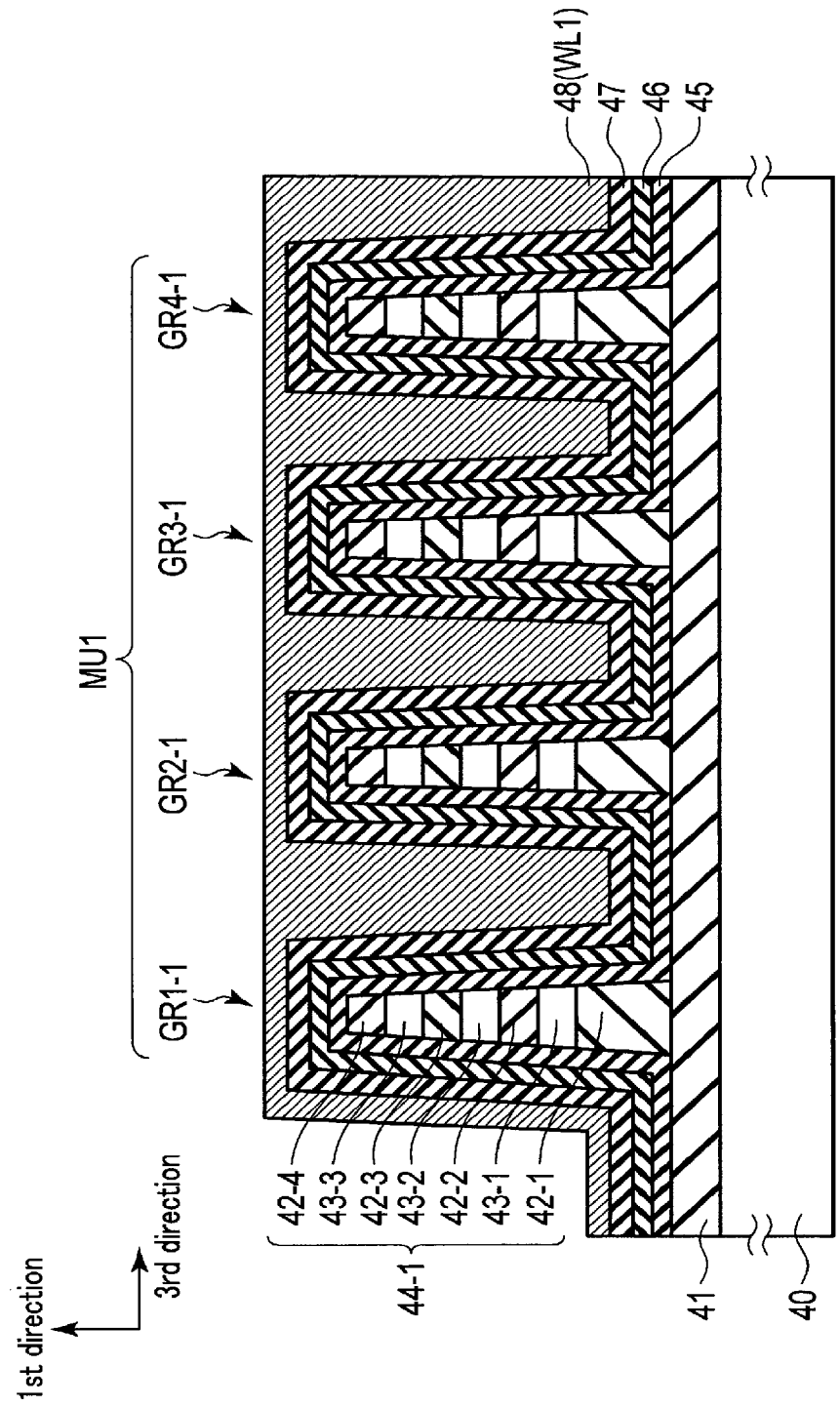

FIGS. 23 and 24 are perspective and plan views of the block BLK, respectively, and FIG. 25 is a sectional view taken along a line 25-25 in FIG. 24, and FIG. 26 is a sectional view taken along a line 26-26 in FIG. 24, and FIG. 27 is a sectional view taken along a line 27-27 in FIG. 24. FIGS. 23, 25, and 27 illustrate one memory unit MU, and FIGS. 24 and 26 illustrate the two memory units MU1 and MU2.

As illustrated, an insulating film 41 is formed on a semiconductor substrate 40, and the block BLK is formed on the insulating film 41.

For example, four fin structures 44 (44-1 to 44-4) each having a stripe shape along the second direction perpendicular to the first direction that is the vertical direction with respect to the surface of the semiconductor substrate 40 are formed on the insulating film 41, thereby forming one memory unit MU. Each fin structure 44 includes insulating films 42 (42-1 to 42-4) and semiconductor layers 43 (43-1 to 43-3), which are provided along the second direction. In each fin structure 44, the insulating films 42-1 to 42-4 and the semiconductor layers 43-1 to 43-3 are alternately stacked, thereby forming four stacked structures extending in the vertical direction with respect to the surface of the semiconductor substrate 40. Each fin structure 44 corresponds to one string group GR described with reference to FIG. 22. The semiconductor layer 43-1 of the bottom layer corresponds to the current path (a region where a channel in formed) of the NAND string SR1. The semiconductor layer 43-3 of the top layer corresponds to the current path of the NAND string SR3. The semiconductor layer 43-2 located between them corresponds to the current path of the NAND string SR2.

A gate insulating film 45, a charge accumulation layer 46, a block insulating film 47, and a control gate 48 are sequentially formed on the upper and side surfaces of the fin structures 44 (see FIG. 25). The charge accumulation layer 46 is formed from, for example, an insulating film. The control gate 48 is formed from a conductive film and functions as the word lines WL or the selection gate lines GSL1 and GSL2. The word lines WL and the selection gate lines GSL1 and GSL2 are formed over the plurality of fin structures 44 among the plurality of memory units MU. On the other hand, the control signal lines SSL1 to SSL4 are independent for the individual fin structures 44.

One end of each fin structure 44 is led to an end of the block BLK and connected to the bit line BL in the led region. That is, for example, focusing on the memory unit MU1, one-end sides of the odd-numbered fin structures 44-1 and 44-3 are led to a certain region along the second direction and commonly connected. Contact plugs BC1 to BC3 are formed in this region. The contact plug BC1 formed in this region connects the semiconductor layers 43-1 of the string groups GR1 and GR3 and the bit line BL1, and is insulated from the semiconductor layers 43-2 and 43-3. The contact plug BC2 connects the semiconductor layers 43-2 of the string groups GR1 and GR3 and the bit line BL2, and is insulated from the semiconductor layers 43-1 and 43-3. The contact plug BC3 connects the semiconductor layers 43-3 of the string groups GR1 and GR3 and the bit line BL3, and is insulated from the semiconductor layers 43-1 and 43-2.

On the other hand, one-end sides of the even-numbered fin structures 44-2 and 44-4 are led to a region facing the one-end sides of the fin structures 44-1 and 44-3 along the second direction and commonly connected. The contact plugs BC1 to BC3 are formed in this region. The contact plug BC1 formed in this region connects the semiconductor layers 43-1 of the string groups GR2 and GR4 and the bit line BL1, and is insulated from the semiconductor layers 43-2 and 43-3. The contact plug BC2 connects the semiconductor layers 43-2 of the string groups GR2 and GR4 and the bit line BL2, and is insulated from the semiconductor layers 43-1 and 43-3. The contact plug BC3 connects the semiconductor layers 43-3 of the string groups GR2 and GR4 and the bit line BL3, and is insulated from the semiconductor layers 43-1 and 43-2.

The above description applies to the memory unit MU1, as a matter of course. For example, in the memory unit MU2, contact plugs BC4 to BC6 are formed, which connect the semiconductor layers 43-1 to 43-3 to the bit lines BL4 to BL6, respectively (see FIG. 26).

A contact plug SC is formed on the other end of each fin structure 44. The contact plugs SC connect the semiconductor layers 43-1 to 43-3 to the source lines SL.

In the above-described arrangement, the sizes of memory cell transistors included in the NAND strings SR1 to SR3 are different from each other. More specifically, as shown in FIG. 25, in each fin structure 44, the width of the semiconductor layer 43 along the third direction is large in a lower layer, and small in an upper layer. That is, the semiconductor layer 43-1 has the maximum width, the semiconductor layer 43-3 has the minimum width, and the semiconductor layer 43-2 has an intermediate width. That is, the plurality of memory cell transistors MT with characteristics that are different from each other due to manufacturing variations are included in one page.

5.2 Arrangement of Sense Amplifier

The sense amplifier 113 will be described next. The sense amplifier 113 according to this embodiment determines data by sensing, for example, a voltage. The sense amplifier 113 may be of a type for sensing a current, as a matter of course.

The sense amplifier of voltage sensing type performs a sense operation while shielding adjacent bit lines. That is, the voltage sensing type senses a voltage variation in a bit line. When one bit line is discharged, a bit line adjacent to this bit line is affected by a potential variation in the discharged bit line because of coupling. As a result, a data read error may occur. Hence, in the voltage sensing type, data is read from even-numbered bit lines or odd-numbered bit lines. When reading data from the even-numbered bit lines, the odd-numbered bit lines are fixed to a predetermined potential (shielded). When reading data from the odd-numbered bit lines, the even-numbered bit lines are fixed to a predetermined potential.

In the method of shielding adjacent bit lines (to be referred to as a "bit line shield method" hereinafter), as shown in FIG. 28, the sense amplifier 113 includes a plurality of sense circuits (S/A & latch). One sense circuit (S/A & latch) is shared by two bit lines. That is, an arrangement in which adjacent bit lines are classified into EVEN and ODD, and EVEN and ODD bit lines adjacent to each other share one sense circuit is employed.

In the reading operation of the bit line shield method, when reading data of an even-numbered bit line, a transfer gate (BLSe) for the even-numbered bit line is turned on to connect the even-numbered bit line to the sense amplifier. At this time, a ground transistor (BIASo) is turned on, thereby connecting the odd-numbered bit line to BLCRL and setting it to a predetermined potential. When the sense amplifier (S/A) precharges the even-numbered bit line in this state, the even-numbered bit line is appropriately precharged without any influence from the odd-numbered bit line because the potential of the odd-numbered bit line is held at the predetermined potential. This precharge potential is determined by a gate voltage called a signal BLCLAMP to, for example, 0.7 V.

On the other hand, when reading data of an odd-numbered bit line, a transfer gate (BLSo) for the odd-numbered bit line is turned on to connect the odd-numbered bit line to the sense amplifier. At this time, a ground transistor (BIASe) is turned on, thereby connecting the even-numbered bit line to BLCRL. When the sense amplifier (S/A) precharges the odd-numbered bit line in this state, the odd-numbered bit line is appropriately precharged without any influence from the even-numbered bit line because the potential of the even-numbered bit line is held at the predetermined potential. This precharge potential is also clamped by the signal BLCLAMP as in the case in which the even-numbered bit line is precharged.

As described above, in the bit line shield method, the unselected adjacent bit line is grounded in the reading operation, thereby performing a correct reading operation without any influence of the signal of the adjacent bit line.

FIG. 29 is a circuit diagram of the sense circuit (S/A & latch) corresponding to a pair of bit lines BLo and BLe (for example, BL1 and BL2) shown in FIG. 28.

As shown in FIG. 29, the sense circuit includes a primary data cache (PDC) 430, a secondary data cache (SDC) 431, three dynamic data caches (DDC) 433 (433-1 to 433-3), and a temporary data cache (TDC) 434. Note that the dynamic data cache 433 and the temporary data cache 434 are provided as needed. At the time of program, the dynamic data cache 433 can be used as a cache for holding data to write an intermediate potential (VQPW) between VDD (high potential) and VSS (low potential) to a bit line.

The primary data cache 430 includes clocked inverters CLI1 and CLI2 and an n-channel MOS transistor NMOS5. The secondary data cache 431 includes clocked inverters CLI3 and CLI4 and n-channel MOS transistors NMOS6 and NMOS7. Each dynamic data cache 433 includes n-channel MOS transistors NMOS4 and NMOS9. The temporary data cache 434 includes a capacitor C1. The circuit arrangements of the primary data cache 430, the secondary data cache 431, dynamic data cache 433, and the temporary data cache 434 are not limited to those shown in FIG. 29, and other circuit arrangements may be employed.

In the example of FIG. 29, an n-channel MOS transistor is used as a transistor that controls data input/output in each data cache. However, a p-channel MOS transistor may be used.

By n-channel MOS transistors HN2$e$ and HN2$o$, the sense circuit is connected to the corresponding even-numbered bit line BLe and odd-numbered bit line BLo. Signals BLSe and BLSo are input to the gates of the transistors HN2$e$ and HN2$o$, respectively. The sources of n-channel MOS transistors HN1$e$ and HN1$o$ are connected to the even-numbered bit line BLe and the odd-numbered bit line BLo. The signals BIASe and BIASo are input to the gates of the transistors HN1$e$ and HN1$o$. The signal BLCRL is input to the drains of the transistors HN1$e$ and HN1$o$.

5.3 Shift Table

FIG. 30 is a conceptual view of a shift table according to this embodiment. As shown in FIG. 30, the shift table according to this embodiment holds the voltage shift amount to be given to the signal BLCLAMP for each bit line, unlike the first to third embodiments. That is, in this embodiment, not the word line voltage but the bit line voltage has layer dependence.

For example, in the first retry reading, the potential of the signal BLCLAMP is shifted by Vshift_bot_1 for the bit lines BL1 and BL4 connected to the NAND string SR1 of the bottom layer. For the bit lines BL3 and BL6 connected to the NAND string SR3 of the top layer, the potential of the signal BLCLAMP is shifted by Vshift_top_1. For the bit lines BL2 and BL5 connected to the NAND string SR2 of the middle layer, the potential of the signal BLCLAMP is shifted by Vshift_mid_1. This also applies to the second and subsequent retry reading. Note that a relationship Vshift_hot_$i$>Vshift_mid_$i$>Vshift_top_$i$ holds ($i$ is a natural number, $i \geq 1$).

The positional relationship of NAND strings SR and the signal BLCLAMP (that is, the precharge potential) have a relationship as shown in FIG. 31. That is, the lower the position of the NAND string SR is (that is, the larger the cell size is), the smaller the signal BLCLAMP is. As a result, the precharge level of the bit line is also lowered. Conversely, the higher the position of the NAND string SR is (that is, the smaller the cell size is), the larger the signal BLCLAMP is. As a result, the precharge level of the bit line is also raised.

FIG. 32 is a graph showing the potential of the signal BLCLAMP and the precharge level of the bit line in normal reading and retry reading.

As shown in FIG. 32, in normal reading, BLCLAMP=Vclamp is set, and the bit line potential is set to Vprecharge.

In the first retry reading, the sense circuit sets BLCLAMP in accordance with the shift table. That is, for the bit lines BL1 and BL4 located in the bottom layer, (Vclamp-Vshift_bot_1) is set. For the bit lines BL2 and BL5 located in the middle layer, (Vclamp-Vshift_mid_1) is set. For the bit lines BL3 and BL6 located in the top layer, (Vclamp-Vshift_top_1) is set. As the result, the precharge level is set to the highest level for BL3 and BL6 out of the bit lines BL1 to BL6, the next highest level for BL2 and BL5, and the lowest level for BL1 and BL4.

After that, as shown in FIG. 32, every time retry reading is repeated, BLCLAMP and the precharge level are lowered. In the final n-th retry reading, BLCLAMP is set to be larger than Vclamp.

5.4 Reading Operation

Figure 33:
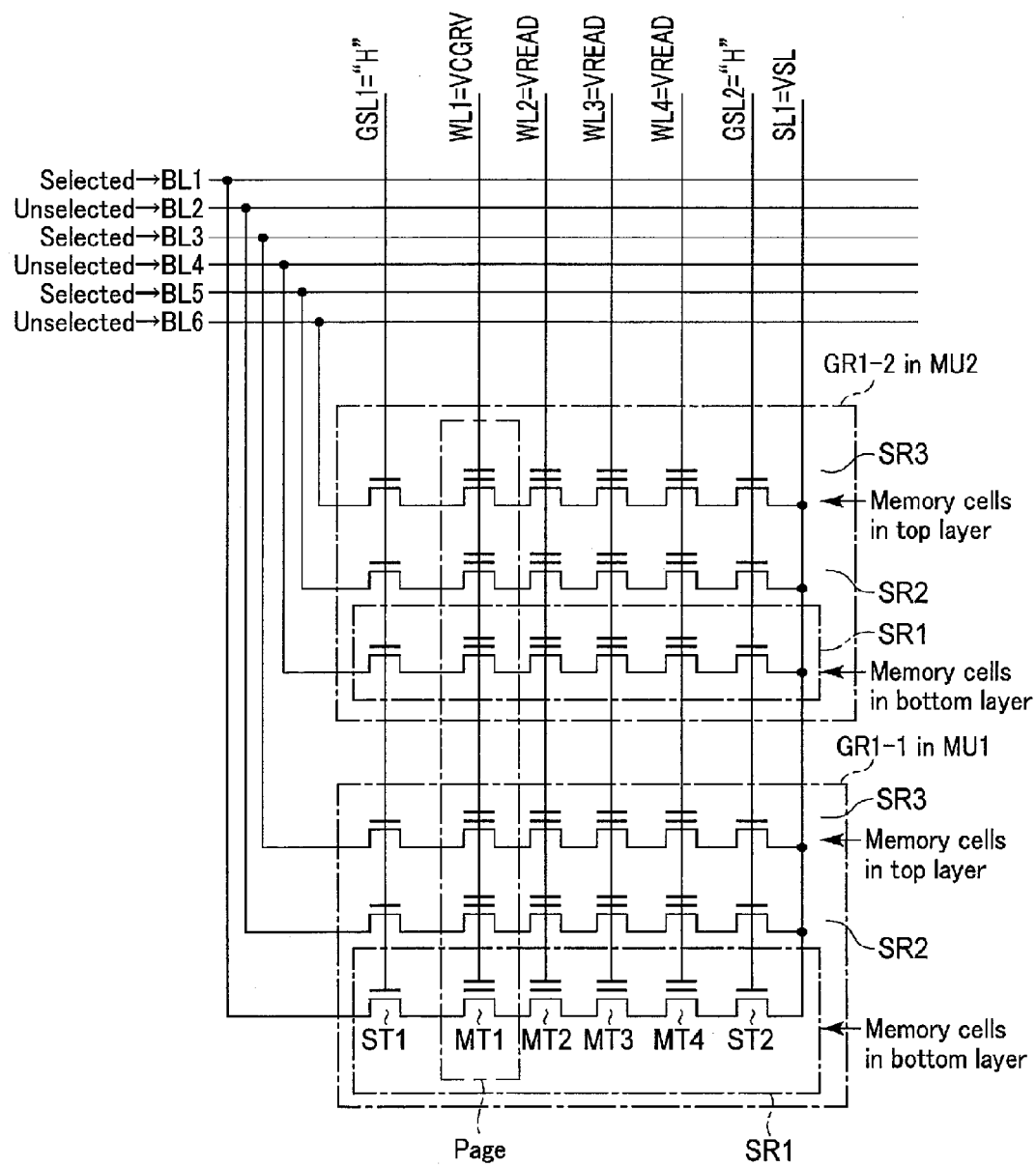
FIG. 33 is a circuit diagram of the memory cell array according to the fifth embodiment.

FIG. 33 shows the voltage relationship of the interconnects of the memory cell array 111 in the reading operation according to this embodiment. FIG. 33 is a circuit diagram of a block BLK. For the descriptive convenience, FIG. 33 shows a case in which only the two memory units MU1 and MU2 are included in the block BLK. FIG. 33 shows a case in which the string group GR1-1 in the memory unit MU1 and the string group GR1-2 in the memory unit MU2 are selected by selecting the control signal lines SSL1 and SSL5. Hence, a page is formed from six memory cell transistors MT connected to the same word line WL in the string groups GR1-1 and GR1-2. Note that FIG. 33 illustrates only the selected string groups GR1-1 and GR1-2, and the column select gates CSG are not illustrated because the space is limited. The following explanation also applies to a case in which another combination of string groups is selected.

The row decoder 112 applies "H" level to the control signal lines GSL1 and GSL2, thereby turning on the selection transistors ST1. In addition, a read voltage VCGRV is applied to the selected word line WL1, and a voltage VREAD is applied to the unselected word lines WL2 to WL4. A source line driver (not shown) applies a voltage VCSL (>0 V) to a source line SL1.

When the voltage VCSL is applied to the source line SL, the sense amplifier 113 detects a current flowing from the source line SL to the bit line BL, thereby determining read data.

Note that as described above, in the string group GR, the semiconductor layer 43 of the memory cell transistor MT (NAND string SR1) located in the bottom layer has the maximum width. Hence, the memory cell transistor is hardly influenced by a disturbance. On the other hand, the semiconductor layer 43 of the memory cell transistor MT (NAND string SR3) located in the top layer has the minimum width. Hence, the memory cell transistor is readily influenced by a disturbance.

The operation of the sense circuit in normal reading will be described next with reference to FIG. 34. FIG. 34 is a timing chart of various kinds of signals of the sense circuit in data reading according to this embodiment. FIG. 34 shows a case in which the odd-numbered bit line BLo is selected, and the even-numbered bit line BLe is unselected. Each signal is given by the sequencer 121 described with reference to, for example, FIG. 2.

As shown in FIG. 34, at time t0, the selection gate line GSL1 of the selected block is set to "High" level. The voltage VCSL is applied to the source line SL1 and the unselected even-numbered bit line BLe. The signal BLCLAMP is set to the power supply voltage VDD. The row decoder 112 applies the voltage VCGRV to the selected word line WL and the voltage VREAD to the unselected word lines WL.

Next, at time t1, a signal BLPRE is set to "High" level. At time t2, in the sense circuit, a signal VPRE is set to "high" level, and the temporary data cache (TDC) 434 is precharged.

At times t2 to t3, the bit line selection signals BLSe and BLSo and the bias selection signals BIASe and BIASo are set. In the example of FIG. 34, since the odd-numbered bit line BLo is selected, the odd-numbered bit line selection signal BLSo is set to "High" level. To fix the even-numbered bit line BLe to BLCTRL (=VCSL), the signal BIASe is set to "High" level.

A clamp voltage Vclamp for bit line precharge is applied to the signal BLCLAMP. The odd-numbered bit line BLo is thus precharged to (Vclamp-Vtblc) (for example, 0.7 V). Vtblc is the threshold voltage of the transistor NMOS10.

In the core portion, the odd-numbered bit line BLo is thus charged to (Vclamp-Vtblc), and the even-numbered bit line BLe is fixed to VCSL.

At time t4, the signal BLCLAMP is set to 0 V. At time t5, the selection gate line GSL2 is set to "High" level. As a result, a current flows from the source line SL1 to the bit line BLo, and the potential of the bit line BLo changes to (VCGRV-Vth). Vth is the threshold voltage is the memory cell transistor.

At times t7 to t8, a sense voltage Vsen is applied to the signal BLCLAMP. At this time, if the potential of the selected bit line BLo is higher than (Vsen-Vtblc), the transistor NMOS10 (the transistor of BLCLAMP) remains cutoff, and the node TDC holds VDD. On the other hand, if the potential of the selected odd-numbered bit line BLo is lower than (Vsen-Vtblc), the transistor NMOS10 is turned on, and the potential of the node TDC almost equals the potential of the bit line BLo.

At times t9 to t10, the secondary data cache SDC receives the sensed data.

In the above-described way, data is read from the odd-numbered bit line BLo. After that, at times t10 to t11, a recovery operation is performed to reset the nodes and signals.

Read from the even-numbered bit line BLe is performed in the same way. In this case, contrary to the example of FIG. 34, the signal BLe is set to "High", and the signal BLSo is set to "Low". In addition, the signal BIASo is set to "High", and the signal BIASe is set to "Low".

FIG. 35 is a timing chart of main signals at the time of first retry reading. As shown in FIG. 35, unlike the normal reading, the precharge potential changes depending on the position of the layer of the NAND string SR that the bit line BL corresponds to.

That is, the signals BLCLAMP for the bit line BL1 (corresponding to the NAND string SR1 located in the bottom layer), the bit line BL5 (corresponding to the NAND string SR2 located in the middle layer), and the bit line BL3 (corresponding to the NAND string SR3 located in the top layer) are Vpre1 (=Vclamp-Vshift_bot_1), Vpre2 (=Vclamp-Vshift_mid_1), and Vpre3 (=Vclamp-Vshift_top_1), respectively. However, a relationship Vpre3>Vpre2>Vpre1 holds.

As a result, the precharge potentials of the bit lines BL1, BL5, and BL3 are (Vpre1-Vtblc), (Vpre2-Vtblc), and (Vpre3-Vtblc), respectively.

This also applies to the second and subsequent retry reading.

5.5 Effects of this Embodiment

In this embodiment as well, the same effects as in the first embodiment can be obtained. That is, according to the arrangement of this embodiment, the plurality of memory cell transistors MT with different degrees of influence of disturbance are connected to the same word line WL. Hence, it is difficult to compensate for the variation in the threshold voltage by shifting the word line voltage.

In this embodiment, the variation in the threshold voltage is compensated by controlling the potential of the bit line BL on a layer basis. That is, as shown in FIG. 35, the precharge potential is set low for the bit line of the NAND string SR located in a lower layer and high for the bit line in an upper layer. In a memory cell transistor located in a lower layer, the threshold voltage variation caused by a disturbance is large, and the threshold voltage readily moves to the positive side. On the other hand, in a memory cell transistor located in an upper layer, the threshold voltage variation is small. Hence, the difference in the threshold voltage variation amount is compensated by the precharge potential. As a result, a variation in the bit line voltage (VCGRV-Vth) between bit lines after data read can be reduced.

Note that as described above, data is determined using the voltage Vsen. That is, data is determined by comparing the bit line voltage VBL and (Vsen-Vtblc). Hence, not only the precharge potential but also the voltage Vsen may have layer dependence. Alternatively, not the precharge potential (Vpre1 to Vpre3 described above) but the voltage Vsen may have layer dependence.

This embodiment is also applicable to the second and third embodiments. That is, as described in the second embodiment, when the number of layers of NAND strings SR increases, the plurality of bit lines BL may be managed as one zone, and the voltage shift amount may be controlled on a zone basis. In addition, as described in the third embodiment, the controller 200 may hold the shift table shown in FIG. 30.

6. Sixth Embodiment

A semiconductor memory device according to the sixth embodiment will be described next. In this embodiment, NAND strings SR1 to SR3 are selected by source lines SL, unlike the fifth embodiment.

6.1 Arrangement of Memory Cell Array

Figure 36:
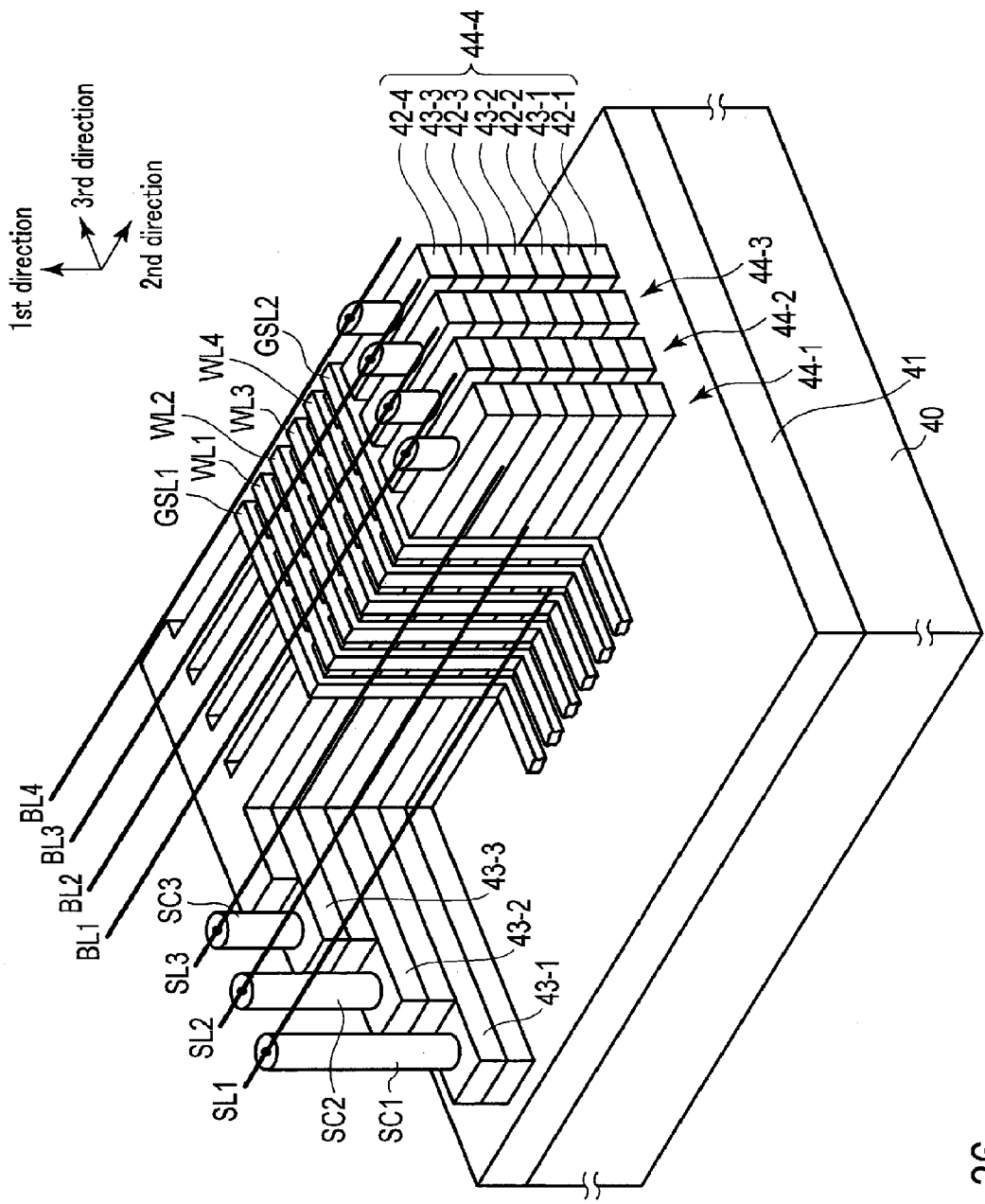

FIG. 36 is a perspective view of a block BLK according to this embodiment. FIG. 36 shows one memory unit MU.

FIG. 37 is a plan view of the memory unit MU. FIG. 38 is a sectional view taken along a line 38-38 in FIG. 37. FIG. 39 is a sectional view taken along a line 39-39 in FIG. 37.

As shown in the drawings, in the arrangement according to this embodiment, one-end sides of a plurality of fin structures 44 are led to an end of the block BLK and connected to bit lines BL in the led region, and the other-end sides are commonly connected and also connected to the source lines SL in the arrangement described in the fifth embodiment. Each bit line BL is commonly connected to semiconductor layers 43-1 to 43-3 of a corresponding fin structure 44 (see FIG. 39). On the other hand, the source lines SL are provided independently for the semiconductor layers 43-1 to 43-3 of the commonly connected fin structures 44 (see FIG. 38). In this example, the control signal lines SSL according to the fifth embodiment are abandoned.

6.2 Reading Operation

A reading operation according to this embodiment is basically the same as in the fifth embodiment. In this example, however, the bit lines BL are commonly connected to a plurality of NAND strings SR included in one string group GR. Hence, one NAND string SR is selected from each string group GR by controlling the potential of the source line SL.

For example, when selecting the NAND string SR1 of the bottom layer, a corresponding source line SL1 is selected, and, for example, 1 V is applied to the selected source line SL1. A voltage (for example, 1.5 V) higher than that of the selected source line SL1 is applied to remaining unselected source lines SL2 and SL3.

The potential (Vpre and/or Vsen) of a signal BLCLAMP is controlled based on the layer in which the selected NAND string SR is located, as described above in the fifth embodiment.

6.3 Effects of this Embodiment

As Described Above, Even when a Memory Cell Array having the arrangement according to this embodiment is provided, the same effects as in the first embodiment can be obtained. The second or third embodiment is also applicable, as a matter of course.

7. Modification and the Like

As described above, the semiconductor memory device 100 according to each of the above embodiments includes a first memory cell provided above a semiconductor substrate, a second memory cell stacked above the first memory cell, a word line electrically connected to gates of the first memory cell and the second memory cell, a first bit line electrically connected to one end of the first memory cell, and a second bit line electrically connected to one end of the second memory cell. In data reading, a first read voltage is applied to the word line. In retry reading, a second read voltage is applied to the word line, and a voltage applied to the first bit line is different from a voltage applied to the second bit line.

With this arrangement, a reading operation according to a disturbance that changes between layers can be performed, and the operation reliability of a NAND flash memory can be improved.

However, the embodiments are not limited to the above-described form, and various modifications can be made. For example, in the embodiments, an example in which the word line voltage or BLCLAMP (bit line voltage) has layer dependence in retry reading has been described. However, the voltage may have layer dependence in normal reading as well. Further, depending on the characteristic of the memory cell, not only one of the word line voltage and BLCLAMP (bit line voltage) but both may have layer dependence.

In the first to fourth embodiments, an example in which the diameter $d_{MH}$ of the memory hole MH is small in a lower layer and large in an upper layer has been described. However, the embodiments are not limited to a case in which the memory hole MH has such a shape. For example, the diameter $d_{MH}$ may sequentially increase from the bottom layer to the Nth layer, narrow in the (N+1)th layer, and then increase again from there. In this case, the word line voltage VCGRV is controlled based on not the depth of the layer but the diameter $d_{MH}$ itself. That is, the relationship between a layer and the diameter $d_{MH}$ of the memory hole MH is not particularly limited. In the above embodiments, the word line voltage is changed in accordance with the magnitude of the disturbance depending on the diameter $d_{MH}$. This also applies to the fifth and sixth embodiments. That is, the embodiments are not limited to a case in which the width of the semiconductor layer 43-1 (the current path of a memory cell) is large in a lower layer.

Hence, the voltage shift amount Vshift is not determined simply by the layer. Preferably, for example, how much the threshold voltage of each layer shifts is actually measured using a tester or the like in a pre-shipment test, and a shift table is created based on the measurement result.

In the embodiments, an example in which the memory cell transistor holds 2-bit data has been described. However, the memory cell transistor may hold 1-bit data or data of three or more bits.

In addition, the arrangement of the memory cell array 111 is not limited to those described in the embodiments. That is, an arrangement in which the characteristic difference of memory cell transistors has position dependence can widely be applied. The word line potential or bit line potential is controlled so as to cancel the position dependence. Hence, the above-described embodiments are applicable not only to a NAND flash memory but also to other general memory devices. The embodiments may independently be implemented, or a plurality of combinable embodiments may be implemented in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell provided above a semiconductor substrate;
   a second memory cell stacked above the first memory cell;
   a word line electrically connected to gates of the first memory cell and the second memory cell;
   a first bit line electrically connected to one end of the first memory cell;
   a second bit line electrically connected to one end of the second memory cell; and
   a control circuit configured to apply in data reading, a first read voltage to the word line, and apply in retry reading, a second read voltage to the word line and voltages to the first bit line and the second bit line,
   wherein a voltage applied to the first bit line is different from a voltage applied to the second bit line.

2. The device according to claim 1, wherein
   the retry reading includes first retry reading and second retry reading executed after the first retry reading,
   the voltage applied to the first bit line in the first retry reading is higher than the voltage applied to the first bit line in the second retry reading, and
   the voltage applied to the second bit line in the first retry reading is higher than the voltage applied to the second bit line in the second retry reading.

3. The device according to claim 2, wherein
   the retry reading further includes third retry reading executed after the second retry reading,
   the voltage applied to the first bit line in the third retry reading is higher than the voltage applied to the first bit line in the first retry reading, and
   the voltage applied to the second bit line in the third retry reading is higher than the voltage applied to the second bit line in the first retry reading.

4. The device according to claim 2, further comprising a first transistor and a second transistor configured to control the voltages to be applied to the first bit line and the second bit line, wherein
   in the retry reading, a first clamp voltage and a second clamp voltage are applied to gates of the first transistor and the second transistor, respectively, and
   the first clamp voltage is lower than the second clamp voltage.

5. The device according to claim 1, wherein
   the first memory cell is formed in a first layer,
   the second memory cell is formed in a second layer above the first layer, and
   the voltage applied to the first bit line is lower than the voltage applied to the second bit line.

6. The device according to claim 1, further comprising:
   a third memory cell between the first memory cell and a second memory cell;
   a fourth memory cell above the second memory cell;
   a third bit line electrically connected to one end of the third memory cell; and
   a fourth bit line electrically connected to one end of the fourth memory cell, wherein
   gates of the third memory cell and the fourth memory cell are connected to the word line,
   the control circuit is further configured to apply voltages to the third bit line and the fourth bit line, and
   in the retry reading, voltages applied to the first bit line and the third bit line are different from voltages applied to the second bit line and the fourth bit line.

7. The device according to claim 1, further comprising:
   a plurality of stacked structures, wherein
   each of the stacked structure includes insulating layers and first semiconductor layers alternately stacked along a first direction perpendicular to a surface of the semiconductor substrate, and
   each of the stacked structure has a stripe shape along a second direction perpendicular to the first direction;
   the word line formed on a side surface of the plurality of stacked structures and commonly connected between the stacked structures;
   a first selection control line formed on a side surface on one-end side of a first stacked structure out of the plurality of stacked structures and configured to select the first stacked structure; and
   a second selection control line formed on a side surface on other-end side of a second stacked structure out of the plurality of stacked structures and configured to select the second stacked structure,
   wherein the stacked first semiconductor layers function as current paths of the first memory cell and the second memory cell.

8. A semiconductor memory device comprising:
   a first memory cell provided above a semiconductor substrate;

a second memory cell stacked above the first memory cell;

a first word line connected to a gate of the first memory cell;

a second word line connected to a gate of the second memory cell;

a bit line electrically connected to one end of the first memory cell and one end of the second memory cell; and a control circuit configured to apply voltages to the first word line and the second word line, wherein in retry reading, a voltage applied to the first word line is different form a voltage applied to the second word line.

9. The device according to claim 8, wherein the retry reading includes first retry reading and second retry reading executed after the first retry reading, the voltage applied to the first word line in the first retry reading is lower than the voltage applied to the first word line in the second retry reading, and the voltage applied to the second word line in the first retry reading is lower than the voltage applied to the second word line in the second retry reading.

10. The device according to claim 9, wherein the retry reading further includes third retry reading executed after the second retry reading, the voltage applied to the first word line in the third retry reading is lower than the voltage applied to the first word line in the first retry reading, and the voltage applied to the second word line in the third retry reading is lower than the voltage applied to the first word line in the first retry reading.

11. The device according to claim 8, wherein the first memory cell is formed in a first layer, the second memory cell is formed in a second layer above the first layer, and the voltage applied to the first word line is higher than the voltage applied to the second word line.

12. The device according to claim 8, further comprising:

a third memory cell between the first memory cell and a second memory cell;

a fourth memory cell above the second memory cell;

a third word line connected to a gate of the third memory cell; and a fourth word line connected to a gate of the fourth memory cell, wherein the control circuit is further configured to apply voltages to the third word line and the fourth word line, and in the retry reading, voltages applied to the first word line and the third word line are different from voltages applied to the second word line and the fourth word line.

13. The device according to claim 8, wherein the first memory cell and the second memory cell are connected in series between a first selection transistor and a second selection transistor and connected to the same bit line via a current path of the first selection transistor.

14. A memory system comprising:

the semiconductor memory device of claim 1; and a controller configured to control the semiconductor memory device, wherein the controller holds a table representing a relationship between a layer in which a memory cell is formed and the voltages applied to the first bit line and the second bit line corresponding to the layer, and when reading data from the semiconductor memory device, the controller refers to the table, and issues information of required voltages to be applied to the first bit line and the second bit line and a read command.

15. A memory system comprising:

the semiconductor memory device of claim 1; and a controller configured to control the semiconductor memory device, wherein the semiconductor memory device holds a table representing a relationship between a layer in which a memory cell is formed and voltages to be applied to the first bit line and the second bit line corresponding to the layer, and when reading data from the semiconductor memory device, in response to a read command received from the controller, the semiconductor memory device refers to the table, to apply voltages to the first bit line and the second bit line.

16. A memory device comprising:

a first word line above a semiconductor substrate;

a second word line above the first word line;

a first memory cell coupled to the first word line;

a second memory cell coupled to the second word line; and a controller configured to execute a first read operation, a second read operation, a third read operation, a fourth read operation, a fifth read operation, and a sixth read operation, wherein the first to third read operations are executed for a first address corresponding to the first memory cell, the fourth to sixth read operations are executed for a second address corresponding to the second memory cell, a first voltage, a second voltage, and a third voltage are applied to the first word line in the first to third read operations respectively, a fourth voltage, a fifth voltage, and a sixth voltage are applied to the second word line in the fourth to sixth read operations respectively, a first value difference between the fourth voltage and the fifth voltage is different from a second value difference between the fourth voltage and the sixth voltage, and a third value difference between the first voltage and the second voltage is different from the first value difference.

17. The device according to claim 16, wherein a fourth value difference between the first voltage and the third voltage is different from the third value difference.

18. The device according to claim 16, wherein the second read operation is executed after the first read operation, the fifth read operation is executed after the fourth read operation, the second voltage is higher than the first voltage, and the fifth voltage is higher than the fourth voltage.

19. The device according to claim 18, wherein the third read operation is executed after the second read operation, the sixth read operation is executed after the fifth read operation, the third voltage is lower than the first voltage, and the sixth voltage is lower than the fourth voltage.

20. The device according to claim 16, wherein the first voltage is higher than the fourth voltage.

21. The device according to claim 16, further comprising:

a third word line between the first word line and the second word line, a third memory cell coupled to the third word line, a fourth word line above the third word line, and
a fourth memory cell coupled to the fourth word line, wherein
the controller is further configured to execute a seventh read operation, an eighth read operation, a ninth read operation, a tenth read operation, an eleventh read operation, and a twelfth read operation,
the seventh to ninth read operations are executed for a third address corresponding to the third memory cell,
the tenth to twelfth read operations are executed for a fourth address corresponding to the fourth memory cell,
the first voltage, the second voltage, and the third voltage are applied to the third word line in the seventh to ninth read operations respectively, and
the fourth voltage, the fifth voltage, and the sixth voltage are applied to the fourth word line in the tenth to twelfth read operations respectively.

22. The device according to claim 16, wherein the first memory cell and the second memory cell are connected in series between a first selection transistor and a second selection transistor and connected to the same bit line via a current path of the first selection transistor.

\* \* \* \* \*